United States Patent [19]

Pinkham et al.

[11] Patent Number: 4,667,313
[45] Date of Patent: May 19, 1987

[54] SERIALLY ACCESSED SEMICONDUCTOR MEMORY WITH TAPPED SHIFT REGISTER

[75] Inventors: Raymond Pinkham, Missouri City; Fredrick A. Valente, Houston, both of Tex.

[73] Assignee: Texas Instruments Incorporated, Dallas, Tex.

[21] Appl. No.: 693,424

[22] Filed: Jan. 22, 1985

[51] Int. Cl.4 .............................................. G11C 8/00
[52] U.S. Cl. .................... 365/240; 365/189; 365/221
[58] Field of Search .............. 365/189, 194, 195, 221, 365/230, 233, 239, 240

[56] References Cited

U.S. PATENT DOCUMENTS

| | | | |
|---|---|---|---|
| 3,930,239 | 12/1975 | Salters et al. | 365/240 |
| 4,322,635 | 3/1982 | Redwine | 365/189 X |
| 4,330,852 | 5/1982 | Redwine et al. | 365/221 |
| 4,347,587 | 8/1982 | Rao | 365/189 |
| 4,541,075 | 9/1985 | Dill et al. | 365/189 |

FOREIGN PATENT DOCUMENTS 52-124827 10/1977 Japan .

Primary Examiner—Joseph A. Popek
Attorney, Agent, or Firm—John G. Graham; Rodney M. Anderson

[57] ABSTRACT

A semiconductor memory comprises four arrays (10), (12), (14) and (16) disposed on a single semiconductor chip. Each of the arrays has a serial shift register (86) associated therewith. Data is transferred from the bit lines of the associated array through a transfer gate (90) for storage in the shift register (86). A tap latch (88) is provided on the output of each of the shift bits in the shift register (86) for determining the output therefrom. The tap latch (88) stores a tap decode signal which is decoded from a tap address by the column decoder (30). The column decoder (30) also decodes the column address in the random mode. The tap decode signal selects any of the shift bits in the shift register (86).

22 Claims, 20 Drawing Figures

SERIALLY ACCESSED SEMICONDUCTOR MEMORY WITH TAPPED SHIFT REGISTER

TECHNICAL FIELD OF THE INVENTION

The present invention pertains in general to semiconductor memories and, more particularly, to serial access semiconductor memories with shift registers output that are generally utilized as video RAMS.

CROSS REFERENCE TO RELATED APPLICATION

This application is related to patent application Ser. No. 693,498, patent application Ser. No. 693,421, and patent application Ser. No. 693,422.

BACKGROUND OF THE INVENTION

In video systems, the information displayed is segmented into discrete elements referred to as "pixels", the number of pixels per unit area determining the available resolution. Each of these pixels for a simple black and white system can be defined in terms of one bit of data; whereas, a more complex system utilizing pixels having differing colors and intensity levels requires significantly more bits of data. To display the pixel information stored in memory, data is read from memory and then organized in an interim storage medium in a serial format. As each horizontal line in the display is scanned, the pixel data is serially output and converted to video information. For example, the stored data for each black and white pixel correspond to a predetermined position in the scan line and determines the video output for either a "white" level or a "black" level. The serial formatting of pixel data is described in U.S. Pat. Nos. 4,322,635, issued to Redwine, 4,347,587, issued to Rao and U.S. patent application Ser. No. 567,040 filed on Dec. 30, 1983, all assigned to Texas Instruments Incorporated.

In designing a video memory, two of the primary constraints facing the designer are the number of pixels required per scan line and the scanning rate. This determines how the pixel information is mapped into the memory and the rate at which the stored pixel information must be accessed and serially output. Typically, video memories are "pixel mapped" such that one row of memory elements or portion thereof directly corresponds to the pixel information of a given scan line or portion thereof. For example, in a black and white system having 256 pixels per scan line, a memory having 256 memory elements per row would be utilized. The information in the row is accessed and stored in a serial shift register for serial output therefrom during a given scan line, thereby requiring only one memory access per scan line. While data is being output from the serial shift register to the display, data is being accessed from the memory for updating of display data. This data is transferred to the shift register during the retrace period between adjacent scan lines. Therefore, the number of rows and columns of memory elements is determined by the number of pixels per scan line, the number of bits of information per pixel and the number of scan lines in the display. The operation of the serial shift register is described in more detail in U.S. Pat. Nos. 4,322,635 and 4,347,587, with a typical bit mapped video memory described in U.S. patent application Ser. No. 567,040.

In applications utilizing pixel mapped video memories, a large number of individual memories are arranged in arrays such that a single access operation outputs a predetermined pixel pattern. This allows a large number of pixels and/or bits per pixel to be output during a single access time, thereby reducing the time required to access a given set of information. This array configuration may require the shift registers associated with individual memories to be either cascaded or arranged in parallel.

To facilitate the use of multiple pixel mapped video memories, it is desirable to incorporate more than one memory on a single semiconductor chip. To provide a viable device from both an economical and a marketing standpoint, each of the integrated memories must maintain some degree of independent operation relative to the other memories on the same chip and yet share as many control functions as possible. This is necessary to reduce the number of integrated circuit pins required to interface between the peripheral circuitry and the chip itself and also to reduce the circuit density. When multiple pixel mapped video memories are integrated onto a single semiconductor chip, it is desirable to have independent access to the serial inputs and outputs of each of the memories and also to have independent control of the random Read/Write modes for the memories. This would require separate serial-in and serial-out interface pins for each memory, in addition to separate pins for the Read/Write control functions, resulting in an impractical multi-pin package. Additionally, the control circuitry required to provide the various independent functions would increase the density of the chip circuitry.

In view of the above disadvantages with integrated multiple memory semiconductor chips, it is desirable to provide a multiple memory chip having shared control functions utilizing a minimum number of pins to interface with peripheral circuitry, yet retaining a high degree of independent control of each of the memories in a given chip.

SUMMARY OF THE INVENTION

The present invention disclosed and claimed herein comprises a semiconductor memory having an array of memory elements arranged in rows and columns for storage of data therein. A row decoder is provided for receiving and decoding a row address and selecting one of the rows of memory elements. A column decoder is provided for receiving and decoding a column address and selecting one of the columns of memory elements. The column and row decoders operate in conjunction to select one of the memory elements in the array in the random access mode. A serial shift register is provided having a plurality of shift bits equal in number to the columns of the array with transfer gates disposed therebetween. The transfer gates are operable to transfer data from all of the memory elements in the accessed row for storage in the shift bits of the shift register. A tap circuit is provided for selecting the shift bit from which data is to be output. The tap position is determined by an address input to the column decoder and decoded thereby. Data is then shifted out of the shift register from the tap point, the tap point being the output of any of the shift bits as determined by the tap address input to the column decoder. A control circuit controls whether the output signal from the column decoder decodes a column address or provides a tap decode signal for selecting the output of the shift register.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

By Four Memory Array

Figure 1:
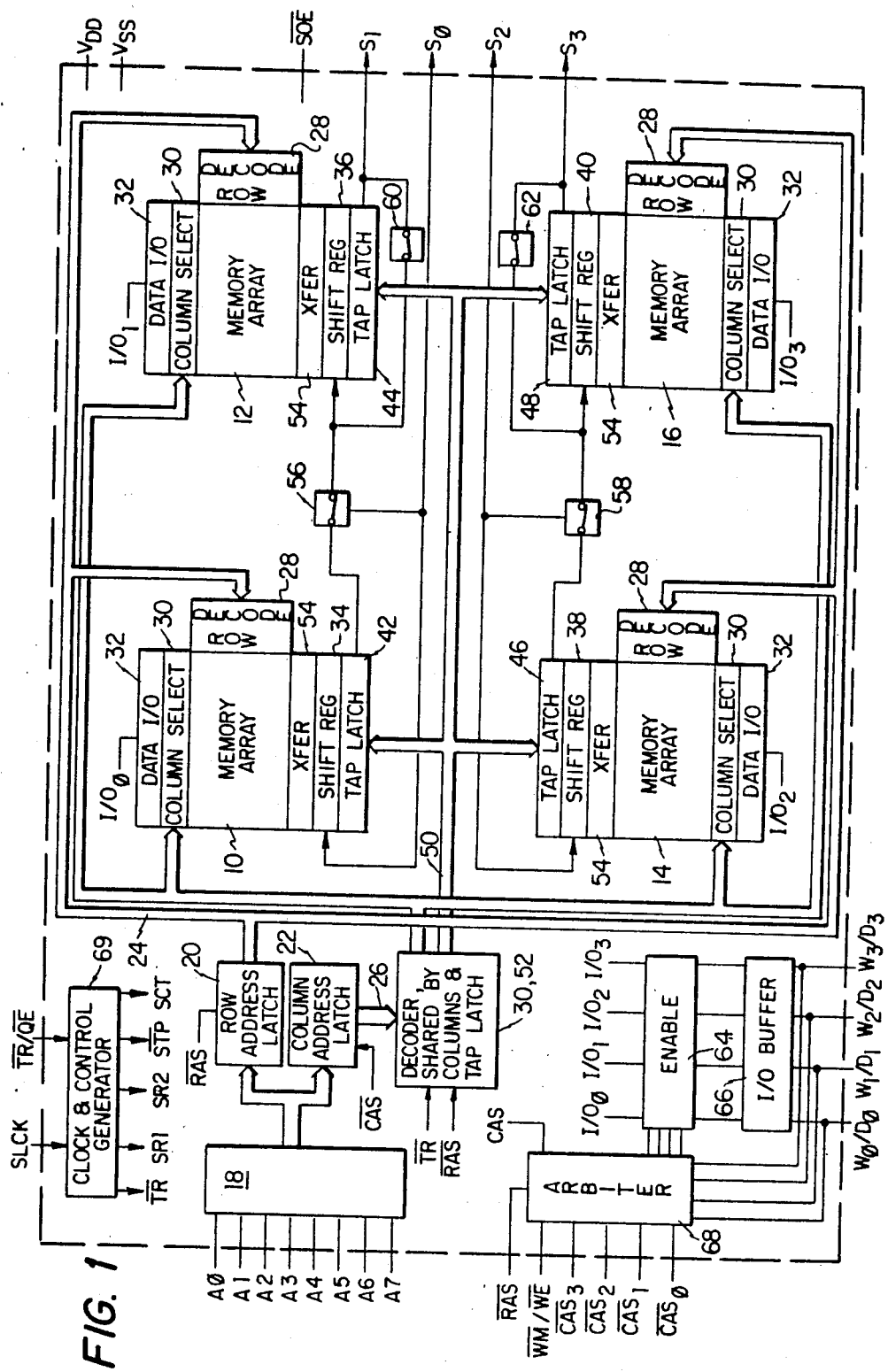
FIG. 1 illustrates a schematic block diagram of a semiconductor chip incorporating four pixel mapped memory arrays in accordance with the present invention.

Referring now to FIG. 1, there is illustrated a semiconductor memory comprised of four memory arrays 10, 12, 14 and 16 referred to hereinafter as a "By Four Memory Array." Each of the memory arrays 10-16 is comprised of a read/write memory organized with both serial access and random access, both of which may use a cell array of the Dynamic Random Access type. All of the arrays 10-16 are included on one semiconductor chip which is usually mounted in a standard dual-in-line package. Memories of this type are generally described in U.S. Pat. No. 4,081,701, issued to White, et al. and assigned to Texas Instruments Incorporated. Each of the arrays is generally split into two halves with an equal number of memory cells in each half to define distinct rows and columns of memory elements. A row of sense amplifiers, each associated with one column, is disposed between the two halves such that activation of one row provides an output on each of the sense amplifiers. Appropriate decoding circuits are then utilized to output all or select ones of the address data bits, as will be described hereinbelow.

Each of the memory arrays 10-16 is arranged in a "bit mapped" configuration; that is, the relative location of a bit of data stored in the memory corresponds to a physical location of a pixel on display. For example, the data stored in the first row and first column of one of the bit mapped arrays could correspond to the first pixel in the first scan line on the video display. If only one array were utilized, the adjacent pixel would correspond to the data stored in the first row and second column of the array. However, if multiple arrays are utilized, adjacent columns in a given array correspond to every nth pixel in the display where n is equal to the number of arrays in parallel. This type of memory is fully described in U.S. patent application Ser. No. 567,040, filed Dec. 30, 1983 and assigned to Texas Instruments Incorporated, "Inside Graphic Systems, From Top To Bottom", Electronic Design, Volume 31, No. 15 (1983), by Novak and Pinkham, "Dedicated Processor Shrinks Graphic Systems To Three Chips", Electronic Design, Volume 31, No. 16 (1983), by Williamson and Rickert and "Video Ram Excells At Fast Graphics", Electronic Design, Volume 31, No. 17 (1983), by Pinkham, Novak & Guttag.

The memory arrays 10-16 are all contained on a single semiconductor chip denoted by a dotted line. An address A0-A7 is received in an address buffer 18, the output of which is input to a row address latch 20 and a column address latch 22. The row address latch 20 is controlled by the row address strobe signal $\overline{RAS}$ and the column address latch 22 is controlled by the column address strobe $\overline{CAS}$. The row address latch 20 is output to a row address bus 24 and the output of the column address latch 22 is output to a column address bus 26. Each of the memory arrays 10-16 has associated therewith a row decoder 28 for receiving the latched row address from a row address bus 24 and a column decoder 30 for receiving the latch column address from the column address bus 26. Although the row and column decoders are shown separate, each of the arrays 10-16 shares a common row decoder and a common column decoder, as will be described hereinbelow.

Each of the memory arrays 10-16 has a data input/output (I/O) circuit 32 associated therewith which is comprised of I/O data lines. The I/O data lines associated with the array 10 are denoted by "I/O$_0$", the I/O lines associated with the array 12 are denoted by "I/O$_1$", the I/O lines associated with the array 14 are denoted by "I/O$_2$" and the I/O lines associated with the array 16 are denoted by "I/O$_3$." In addition, a serial shift register 34 is associated with the array 10, a serial shift register 36 is associated with the array 12, a serial shift register 38 is associated with the array 14 and a serial shift register 40 is associated with the array 16.

Each of the shift registers 34-40 has associated therewith tap latches 42, 44, 46 and 48, respectively. The tap latches 42-48 are operable to select the shift bit of the associated shift registers 34-40, respectively for output therefrom. The tap latches 42-48 are interfaced with a tap latch bus 50 which is connected to the output of a tap latch decode circuit 52. The tap latch decode circuit 52 receives the latched column address from the address bus 26 for decoding thereof. In the preferred embodiment, the tap latch decode circuit 52 and the column decoder 30 are shared functions such that only one decode circuit is required. Control circuitry is provided for determining whether the decoded output is placed onto the tap latch bus 50 or the column decode bus 26, as will be described hereinbelow.

Each of the shift registers 34–40 is comprised of a plurality of serially arranged shift bits, each shift bit therein associated with a separate column in the associated array. A transfer gate 54 is provided for interfacing between the individual columns of each of the arrays 10–16 and the associated shift registers 34–40. This transfer of data can either be from the output of each of the sense amps in the respective memory arrays for loading into the shift bits of the respective shift registers or it can allow transfer of data from the shift register to the associated array. The transfer gates 54 allow for transfer of all of the data in the addressed row to the shift register for serial output therefrom, as will be described hereinbelow. The operation of the transfer gates and the serial shift register is described in detail in U.S. Pat. No. 4,330,852.

The output of the tap latch 42 comprises the serial output of the shift register 34, and this output is input to one input of a Single Pole Double Throw switch 56, which allows for the output of tap latch 42 to switch between the serial input of the shift register 34 and the serial input of the shift register 36. In a similar manner, the output of the tap latch 46, which is the selected output of the shift register 38, is also input to a Single Pole Double Throw switch 58, which selects between the serial input of the shift register 38 and the serial input of the shift register 40 associated with the array 16. The tap latch 44, which selects the output of the shift register 36, is fed back around to the serial input of the shift register 36 through a Single Pole Single Throw switch 60, and the output of the tap latch 48 is also fed back to the serial input of the shift register 40 through a Single Pole Single Throw switch 62. Each of the switches 56–62 is a metal mask programmable option which is selected during fabrication of the semiconductor memory. Although illustrated as switches, they are in actuality a series of lines which are connected or disconnected on the mask prior to fabrication of the device.

The switches 56–62 allow for two modes of operation. In the first mode, the switches 56 and 58 are connected such that the output of the tap latch 42 is connected back to the serial input of the associated shift register 34 and the output of the tap latch 46 is connected back to the serial input of the associated shift register 38. In a similar manner, the switches 60 and 62 are closed such that the outputs of the tap latches 44 and 48 are connected back to the serial inputs of the respective shift registers 36 and 40. In this manner, each of the shift registers 34–38 is configured as a "circulating" shift register.

In the second mode of operation, the switch 56 is configured to connect the tapped output of the shift register 34 to the serial input of the shift register 36 and the switch 58 is configured to connect the tapped output of the shift register 38 to the serial input of the shift register 40. The switches 60 and 62 are configured in the open position such that circulation of data in the shift registers 36 and 40 is inhibited. This second mode of operation essentially cascades shift registers 34 and 36 and shift registers 38 and 40.

To interface with the shift registers in two modes, a signal pin labeled "$S_1$" is connected to the output of the tap latch 44, a signal pin "$S_0$" is interfaced with the serial input of the shift register 34, a signal pin "$S_2$" is interfaced with the serial input of the shift register 38 and a signal pin labeled "$S_3$" is interfaced with the output of the tap latch 48. In the first mode of operation, the pin $S_1$ is multiplexed with both the serial input and output of shift register 36, pin $S_0$ is multiplexed with the serial input and output of shift register 34, pin $S_2$ is multiplexed with the serial input and output of shift register 38 and pin $S_3$ is multiplexed with the serial input and output of shift register 40. Buffers are provided such that data can be input or output to the associated shift registers on pins $S_0$–$S_3$ in response to the serial out enable signal $\overline{SOE}$ to selectively input data or receive output data from the associated shift register. These multiplexed functions will be described hereinbelow with reference to FIG. 5.

In the second mode of operation, the pin $S_1$ is connected to the output of tap latch 44 and the pin $S_O$ is connected to the input of the shift register 34, the shift registers 34 and 36 being cascaded. Pin $S_O$ is connected to the input of shift register 38 and pin $S_3$ is connected to the output of tap latch 48, shift registers 38 and 40 being cascaded. In this mode, data can be serially input to shift register 34 and extracted from the tapped output of shift register 36. In a similar manner, data can be serially input to shift register 38 and extracted from the tapped output of shift register 40.

The switches 56–62 provide the option of selectively accessing each of the shift registers associated with the memory arrays 10–16 on a single multiplexed input/output or, alternatively, cascading the associated shift registers of two of the arrays with a dedicated input and a dedicated output for each cascaded pair. In this manner, only four pins on the integrated circuit package are required. Each of these configurations and the applications therefor will be described in more detail hereinbelow.

Each of the memory arrays 10–16, as described hereinabove, shares a common row decoder and a common column decoder. A row address and the associated $\overline{RAS}$ signal activates the addressed row in each of the arrays 10–16 and a column address and the associated $\overline{CAS}$ signal activates the addressed column on each of the arrays 10–16. Transfer of data can then be effected between the bit lines and either the data I/O circuits 32 or the shift registers 34–40. By sharing a common column and row decoder, a random Read or a random Write function would require reading or writing of data to all of the arrays 10–16 simultaneously. To selectively Write data to one or more of the arrays 10–16 could require separate column decode circuits and associated peripheral control circuitry. This would significantly increase the circuit density on a given chip. In accordance with the present invention, two methods are utilized for separately writing to a desired location in a select one of the memories of the four arrays 10–16 without disturbing data in the same location in the unselected one of the arrays. The first method is referred to as a "Write Mask" feature which inhibits writing to unselected arrays and the second method is referred to as "Separate $\overline{CAS}$" and utilizes separate column address strobes $\overline{CAS}_O$, $\overline{CAS}_1$, $\overline{CAS}_2$ and $\overline{CAS}_3$ to select the array to be written to. As will be described hereinbelow, both of these features are incorporated on the semiconductor chip but only one is activated during fabrication by altering the metal mask.

To selectively alter data in any of the arrays 10–16 or any combination thereof, an enable circuit 64 is provided for interfacing between and I/O buffer 66 and the I/O lines I/O$_0$–I/O$_3$. The enable circuit 64 is controlled by outputs from an arbiter 68 which determines whether the Write Mask feature or the Separate $\overline{CAS}$ feature is utilized. If the enable circuit 64 is controlled to disable any of the I/O outputs associated with the arrays 10–16, the data on the associated bit line cannot be "written over." Only the enabled I/O lines can have the associated bit lines activated such that the associated memory element can have data written thereto.

In the Write Mask mode, the four data pins D$_0$–D$_3$ are multiplexed such that enable signals W$_0$, W$_1$, W$_2$ and W$_3$ can be multiplexed therewith. The signals W$_0$–W$_3$ determine which of the memory arrays 10–16 are to have the associated I/O ports enabled. The disadvantage to the Write Mask feature, as will be described in more detail hereinbelow, is that only one set of values for the signals W$_0$–W$_3$ can be latched for each $\overline{RAS}$ signal. Thereafter, only locations in the selected arrays can be written to. This presents a problem when operating in the page mode.

When the metal mask is altered to select the Separate $\overline{CAS}$ feature, the arbiter 68 distinguishes between the four $\overline{CAS}$ signals. In this mode, the row is selected with the $\overline{RAS}$ signal and then the desired one of the CAS signals $\overline{CAS_0}$–$\overline{CAS_3}$ is input thereto. Therefore, the column address and any one of the columns in the arrays 10–16 can be selected for a given row access. Only one row access is required to operate in the page mode and the $\overline{CAS}$ signals can be controlled during a given row access to select columns from any one of the arrays 10–16 or any combination thereof.

A clock and control generator 69 is also provided on the chip to generate the various clock signals and control signals such as that required to activate the transfer gate and the shift registers 34–40. Two of the signals input to the clock and control generator 69 are the signal for the shift register clock SCLK and the signal for the transfer and output enable signals $\overline{TR/QE}$.

Figure 2:
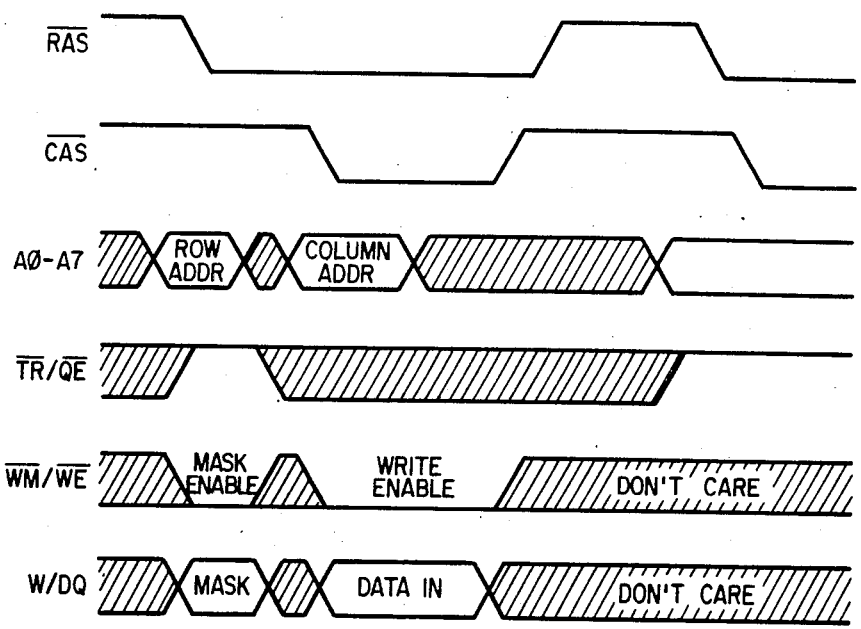
FIG. 2 illustrates timing diagrams for writing data to select ones of the memory cells in accordance with the Write Mask feature.

Referring now to FIG. 2, there is illustrated a timing diagram for the Write cycle for the memory of FIG. 1 illustrating the Write Mask feature. In the conventional RAM, the row address is latched in the row address latch 20 as $\overline{RAS}$ goes low. After a predetermined duration, the column address is placed in the address buffer 18 and $\overline{CAS}$ goes low to latch the column address in the column address latch 22. In the Write mode, the Write/Enable signal $\overline{WE}$ is changed to a low level after the row address is latched. In the Write Mask feature, the $\overline{WM}/\overline{WE}$ signal goes low prior to $\overline{RAS}$ going low. This allows the arbiter 68 to latch any data on the data inputs, representing the signals W$_0$–W$_3$. Since the masked data is latched only once for each change in $\overline{RAS}$, only one set of masked data can be latched for each row address. As described above, this is a disadvantage when operating in the page mode, since different arrays cannot be selected during a given row address.

Cascaded Shift Register

Figure 3:
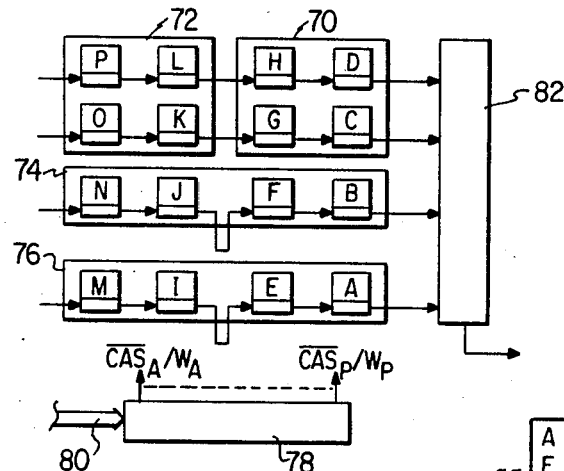
FIG. 3 illustrates a block diagram of a symmetrical pixel memory array.

Referring now to FIG. 3, there is illustrated an array configured of four memories 70, 72, 74 and 76. Each of the memories 70–76 is similar to the memory of FIG. 1, in that four bit memory arrays are contained therein. The memories 70–76 are operated in the second mode of operation with cascaded shift registers. Each pair of cascaded shift registers therefore has a dedicated pin for the serial input to the cascaded pair and a dedicated pin for the serial output to the cascaded pair, requiring four pins on the integrated circuit package to interface with the cascaded pairs. For illustrative purposes, the two cascaded pairs in the memory 70 are cascaded with the two cascaded pairs in the memory 72. The two cascaded pairs in the memory 74 are cascaded with each other and the two cascaded pairs in the memory 76 are cascaded with each other. Regardless of the configuration, the electrical configuration is the same, with only the physical layout of the interconnects changing.

A data update circuit 78 is provided that receives a signal from a microprocessor (not shown) on a bus 80 to generate sixteen separate signals to control either the Separate $\overline{CAS}$ function of each of the memory arrays in the memory 70–76 or, alternately, the Write Mask feature. These outputs are labeled $\overline{CAS}_a/W_a$–$\overline{CAS}_p/W_p$. These signals are associated with separate ones of the memory arrays in memories 70–76 to selectively write in the random mode to those arrays for updating pixel data, as will be described hereinbelow.

Each of the pixel mapped arrays in the memories 70–76 is labeled with a letter indicating its relative position in the array. One cascaded pair in memory 70 is labeled "D" and "H". This cascaded pair is cascaded with arrays "L" and "P" in the memory 72. The other array pair in memory 70 is labeled "C" and "G," which is cascaded with the other array pair in memory 72 labeled "K" and "O" The cascaded arrays in the memory 74 are labeled "B", "F", "J" and "N" and the cascaded arrays in memory 76 are labeled "A", "E", "I" and "M". Therefore, the array of FIG. 3 is configured such that arrays A, B, C and D are arranged in parallel, with the serial outputs thereof connected to four parallel inputs of a four-bit serial shift register 82, the serial output of which is processed for input to a display. The remaining cascaded arrays E–H, I–L and M–P are cascaded in a parallel configuration, such that all of the elements in the cascaded arrays A–D are output to the four-bit shift register 82, followed by all of the shift register data from the arrays E–H, etc. This is referred to as "symmetrical pixel mapping."

Figure 4:
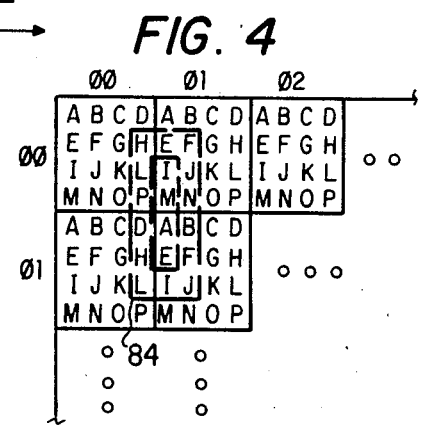
FIG. 4 illustrates a portion of the display map for the array of FIG. 3.

Referring now to FIG. 4, a portion of the video display is illustrated utilizing the symmetrical pixel array of FIG. 3. In accessing one row of data in the symmetrical array, a row address is first supplied and then a column address. The data on the bit lines of each column is then transferred with the transfer gate 54 to the respective shift registers of each of the arrays A–P. Once the data is parallel loaded into the respective shift register, all of the shift registers are clocked by a common shift clock to synchronously shift the data to the four-bit shift register 82. For a 256 bit wide array and a corresponding 256 bit wide shift register, each of the positions is labeled "00" through "255" corresponding to the particular column. The first shift bit output of each of the arrays A through P corresponds to the column address 00. The first data loaded into the four-bit shift register 82 is the data initially stored in column 00 of arrays A–D. After the data is loaded into the four-bit shift register 82, it is shifted out at a data rate four times that of the shift clock. Therefore, the first piece of data output from the four-bit shift register 82 is the data in column 00, row 00 of array A followed by the data in column 00, row 00 of array B. After data corresponding to column 00 of arrays A, B, C and D is output from the four-bit shift register 82 to form the first scan line, the data corresponding to row 00, column 01 is then loaded into shift register 82 to form the second scan line. This continues until all of the data in the shift registers associated with registers A-D is output, which requires 256 shift clocks and 1024 shifts of the four bit shift register 82.

In this example, the display is 256 blocks long which, for the first scan line, is comprised of 1,024 pixels. For the next scan line, the data from the shift registers initially associated with the arrays E-H has been serially loaded into the shift registers associated with the arrays A-D. This data is then serially loaded into the four-bit shift register 82. The next scan line associated with all of the data in the shift registers associated with arrays I-L and the fourth scan line is comprised of the data in the shift registers associated with the arrays M-P. This forms 256 pixel arrays each having the pixels therein labeled A through P. After all of the data associated with row address 00 is output from the shift registers, row 01 is accessed and the data transferred to the associated shift registers and scan lines five through eight are displayed to form the second row of pixel arrays.

By utilizing the symmetrical array of FIG. 3, it is possible to write over sixteen adjacent pixels in any one of the pixel arrays in one memory access time. If only one pixel mapped memory array were utilized, it would require sixteen memory accesses to change the data of the sixteen pixels. In the symmetrical pixel array, it is only necessary to make one random access of the memory arrays A-P, with the data update circuit 78 activated to select the array to be written over at that row and column address and in the desired pattern.

For example, if a pattern illustrated by the reference numeral 84 in FIG. 4 were to be drawn on the display, a conventional system would access each row defining the pattern 84 and change the column address to modify the appropriate pixel memory locations. This would require operation in the page mode for the memory. The row address would then be changed and this step repeated. The pattern 84 is comprised of the pixels H, L, and P in the pixel array in row 00, column 00, pixels E, F, J and N in the pixel array in column 01, row 00, the pixels D, H and L in the pixel array in column 00, row 01 and the pixels B, F, I and J in the pixel array in column 01, row 01. A conventional system would require six row accesses with each row access requiring two column accesses to write over all of the pixel data to form the pattern 84. However, in the symmetrical pixel mapping array of FIG. 3, only four accesses are required to form the pattern 84. The system would first access memory cells in row 00, column 00 of all of the memory arrays A-P and enable only memory arrays H, L, and P for writing to. With the Write Mask option selected for the memory 70-76 in FIG. 3, a new row access would be required prior to changing the enabled pixel arrays for row 00, column 01. However, if the Separate $\overline{CAS}$ option were selected, the page mode would be utilized and only one row access made for updating the pixel information in column 00 and column 01.

By utilizing cascaded shift registers internal to the semiconductor chip having four pixel mapped arrays contained therein, only four pins are required to provide the 4×4 array. This allows for any configuration requiring a symmetrical array that is two pixels wide or any multiple thereof. Therefore, a 4×4 symmetrical pixel array can be utilized, as illustrated in FIG. 3, or even a 16×16 pixel array can be utilized.

Circular Shift Register with Multiple Tapped Output

Figures 5, 6A, 6B, 7A, 7B:
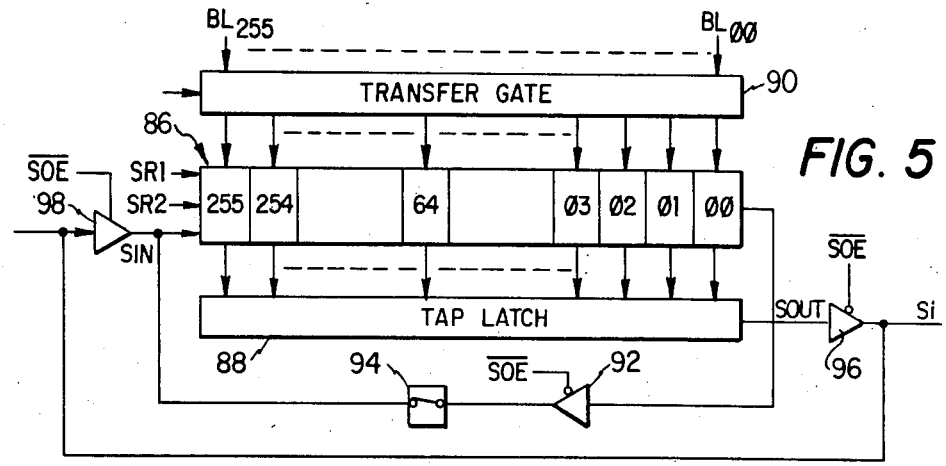
FIG. 5 illustrates a schematic block diagram of the shift register and tap latch.
FIGS. 6a and 6b illustrate a diagram of one scan line for three different display scans utilizing soft panning.
FIGS. 7a and 7b illustrate a diagram of one scan line for three different display scans with the shift register tapped at varying positions.

Referring now to FIG. 5, there is illustrated a schematic block diagram of a 256 bit shift register 86 with an associated 256 bit tap latch 88 and an associated 256 element transfer gate 90. The shift register 86 is similar to the shift registers 34-40, the tap latch 88 is similar to the tap latches 42-48 and the transfer gate 90 is similar to the transfer gate 54 in FIG. 1. The transfer gate receives the bit lines $B/L_{00}$–$B/L_{255}$ on the input and has the outputs thereof connected to the individual shift bits of the shift register 86 labeled "00" through "255," with the serial input being input to shift bit 255 and the serial output being output by shift bit 00. The tap latch 88 is operable to tap the serial output at any one of the shift bits 00 through 255.

The shift output from shift bit 00 is input to a tristate buffer 92, which has the output thereof connected to a Single Pole Single Throw switch 94. The switch 94 is similar to the switches 60 and 62. As described above, the switch 94 may not be utilized if the shift register is configured similar to shift registers 34 and 38 with the Single Pole Double Throw switches 56 and 58. The output of the switch 94 is connected to the serial input of shift bit 255. The output of the tap latch is input to a tristate buffer 96, the output of which is connected to one of the pins $S_1$–$S_3$ which are referred to as "$S_i$," where "i" is equal from "1" to "3". The $S_i$ pin is also input to a tristate buffer 98, the output of which is connected to the serial input of shift bit 255. This input is labeled SIN, whereas the output of the tap latch is labeled SOUT. The tristate buffers 92, 96 and 98 are controlled by the $\overline{SOE}$ signal. When the $\overline{SOE}$ signal is high, buffers 92 and 96 are disabled and buffer 98 enabled. This allows the pin $S_i$ to serve as a serial input pin. When $\overline{SOE}$ is low, buffer 98 is disabled and buffers 92 and 96 enabled. This configures the shift register 86 as a circulating shift register with the output of shift bit 00 input back to shift bit 255 and the output of the tap latch connected to the pin $S_i$. Pin $S_i$, in this configuration, serves as one of the serial output pins. The switch 94 is only opened, as described above, when the mask option is selected wherein two shift registers in a single semiconductor chip are cascaded.

In the preferred embodiment, it is important to note that the serial output is always fed back from shift bit 00 to shift bit 255 and not from the output of the tap latch 88. However, it could be fed back from the tap point. With feedback from shift bit 00, the tap latch can be activated to select the output from any one of the shift bits in the shift register 86 without affecting the order in which the data circulates. For example, shift bit 64 could be selected as the output shift bit such that the first bit appearing on the output would be the data initially stored in shift bit 64, followed by the data initially stored in the remaining shift bits 65-255. However, as the shift clocks continue to shift data, the data stored in shift bit 255 is followed with the data initially stored in shift bit 00. In this manner, the initial order of the data stored in the shift register 86 can be maintained independent of the tap position.

A counter (not shown) counts the number of shift clocks to provide a count output. The external microprocessor which controls the memory provides a reset for the counter on transfer of data to the shift register 86 and then monitors the count. The microprocessor can then transfer data back to the memory at a predetermined count delayed by a predetermined number of shifts. For example, if it is desirable to shift all of the data in a given row of memory by one pixel, it would only be necessary to count 255 counts of the shift clock from the initial position and then transfer the data to the bit lines. This would effectively shift the data by one.

Referring now to FIGS. 6a and 6b, a select line of the display is represented for three separate frames of the display wherein a frame is defined as the time required to scan all of the lines on the display. The frames are referred to as FRAME1, FRAME2 and FRAME3 and the line that is illustrated is referred to as line "N." In the illustrated example, there are 256 pixels for each scan line of the display and a 256 bit wide memory associated shift register is utilized. After transfer of data to the shift register, the timing is such that 256 shifts are made to output all of data contained in the shift register onto the display for a given line. In FRAME1, the first pixel corresponds to shift bit 00 which also corresponds to the data stored in column 00. The last bit of data shifted out at the end of the scan line corresponds to shift bit 255, which also corresponds to column 255. In order to shift the data by one, the counter (not shown) counts the number of shift clock cycles and performs a transfer from shift register to memory at the row address corresponding to that line at a predetermined shift count. The example illustrated in FIG. 6a requires the transfer of data from the shift register to memory to occur after 255 shift clocks. At this count, the data originally in shift bit 00 will now be in shift bit 01. A transfer at a count of 255 will result in the data being shifted to the right by one pixel position corresponding to data being shifted to the next higher column address. Therefore, on the next frame, transfer of data from memory to the shift register results in this shifted data being output. If a transfer from shift register to memory occurs for every count of 255, the data will appear to shift to the right one pixel for every scan. Therefore, scan three for the same line will have the pixel shifted two pixels to the right with respect to FRAME1.

To shift one position to the left, the transfer of data from shift register to memory occurs after a shift count of one. This will result in the data originally in shift bit 00 being in shift bit 255 and the data initially in shift bit 01 being in shift bit 00, thus resulting in a shift to the left of one bit for each scan of the display. This is illustrated in FIG. 6b.

Referring now to FIG. 7a, there is illustrated three sequential frames of line N, similar to the frames of FIGS. 6a and 6b. However, in this example, the number of pixels on each line of the display is a multiple of 192 whereas the shift register and memory are 256 bits wide. The tap on the tap latch 88 is set to extract bits from shift bit 64 such that the first bit in the scan line will be data in shift bit 64 and the last pixel will correspond to data in shift bit 255. In order to shift the data by one to the right, the only change that is necessary is to change the tap from shift bit 64 to shift bit 63. This is evidenced in FRAME2 wherein the first pixel corresponds to data in shift bit 63 and the last bit of data corresponds to data in shift bit 254. On the next frame, indicated by FRAME3, the tap is again incremented down such that it is positioned at shift bit 62. By shifting the tap, the display can be "panned." However, the display can only be panned until the tap is positioned at shift bit 00 wherein the display will correspond to data between shift bit 00 and shift bit 191.

In order to display a constant changing background with a display having less pixels than that provided in the serial shift registers 86, the circulating shift register configuration can be utilized in conjunction with the tap latch 88. This is illustrated in FIG. 7b wherein the tap is set at shift bit 64 for the first frame, FRAME1, and then incremented to shift bit 65 and shift bit 66 in the next two successive frames, respectively. Since the shift register is a circulating shift register, 192 shifts from the shift bit 65 will cause the data stored in shift bit 00 to be output therefrom. In a similar manner, in FRAME3 tapping of the shift register 86 at shift bit 66 results in the data stored in shift bit 00 and shift bit 01 corresponding to the last two pixels in the line after shifting.

Shift Register and Tap Latch

Figures 8, 9, 11:
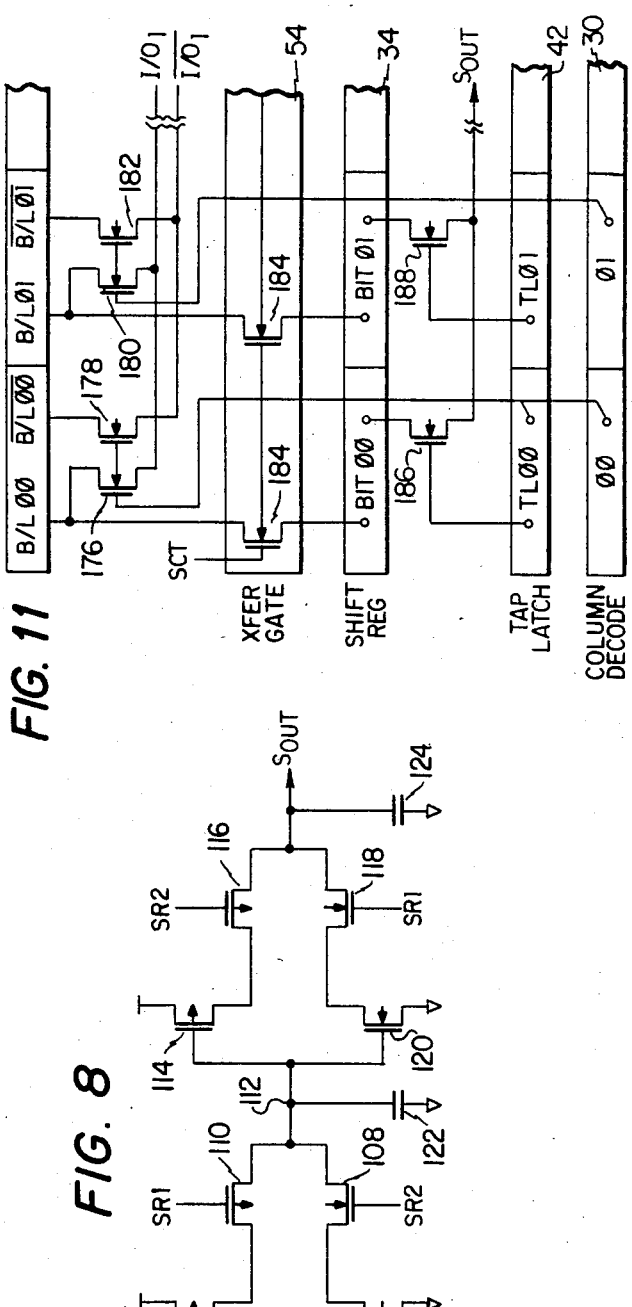
FIG. 8 illustrates a schematic diagram of one shift bit of the shift register.
FIG. 9 illustrates a schematic diagram of three serially connected shift bits.
FIG. 11 illustrates a schematic block diagram of the interface between the tap latch, shift register and column decode circuits.

Referring now to FIG. 8, there is illustrated a schematic block diagram of a single shift bit in the shift register 86 of FIG. 5. The serial input is referred to as "$S_{IN}$" and the serial output is referred as "$S_{OUT}$". The serial input is connected to the gates of a P-channel FET 104 and an N-channel FET 106. The transistor 106 has the source thereof connected to $V_{SS}$ and the drain thereof connected to the source of an N-channel transistor 108. The transistor 104 has the source thereof connected to $V_{DD}$ and the drain thereof connected to the drain of a P-channel transistor 110. The drain of the transistor 110 and drain of the transistor 108 are connected to a node 112 and the gate of the transistor 110 is connected to SR1 and the gate of the transistor 108 is connected to SR2. As described above, SR1 and SR2 are the inverted and noninverted forms of the shift clock. Transistors 104–110 comprise the first stage of a shift bit. The second stage is comprised of P-channel transistors 114 and 116 and N-channel transistors 118 and 120. The transistors 114 and 120 are configured similar to transistors 104 and 106 and transistors 116 and 118 are configured similar to transistors 110 and 108, respectively. The gates of the transistors 114 and 120 are connected to the node 112 and the drain of the transistor 116 and the drain of the transistor 118 are connected to the serial output. A capacitor 122 is connected between the node 112 and VSS and a capacitor 124 is connected between the serial output and $V_{SS}$. The capacitors 122 and 124 represent storage capacitance.

In operation, data is input on the capacitor 124 at the output of the shift bit which also connects it to the gates of the transistors 104 and 106. This data clocked through to node 112 when SR1 is low and SR2 is high. If the data is a logic low level, transistor 104 conducts and if the data is a logic high level, transistor 106 conducts. When SR1 returns to a high level and SR2 returns to a low level, the data is stored on the capacitor 122. To transfer data from node 112 to the serial output, SR1 is applied to the gate of transistor 118 and SR2 is supplied to the gate of transistor 116. Therefore, data is transferred when SR2 is low corresponding to SR1 being high. This is the opposite configuration than that with respect to transfer of data to node 112.

Referring now to FIG. 9, there is illustrated three shift bits 126, 128 and 130 connected in series. For each of the shift bits, transistors 104 and 106 are represented by an inverting amplifier symbol 132 and the transistors 114 and 120 are represented by an inverting amplifier symbol 134. In a transfer cycle, the bit line is connected to the serial output of each of the shift bits with SR1 being low and SR2 being high. This effectively connects the data on the bit line to the input of the amplifier 134 for the next successive shift bit. The bit line (not shown) is then disconnected, with the signal being stored on the capacitor 124. When the shift clock changes states, the signal on the output of the respective shift bit is transferred to the output of the next shift bit.

Figure 10:
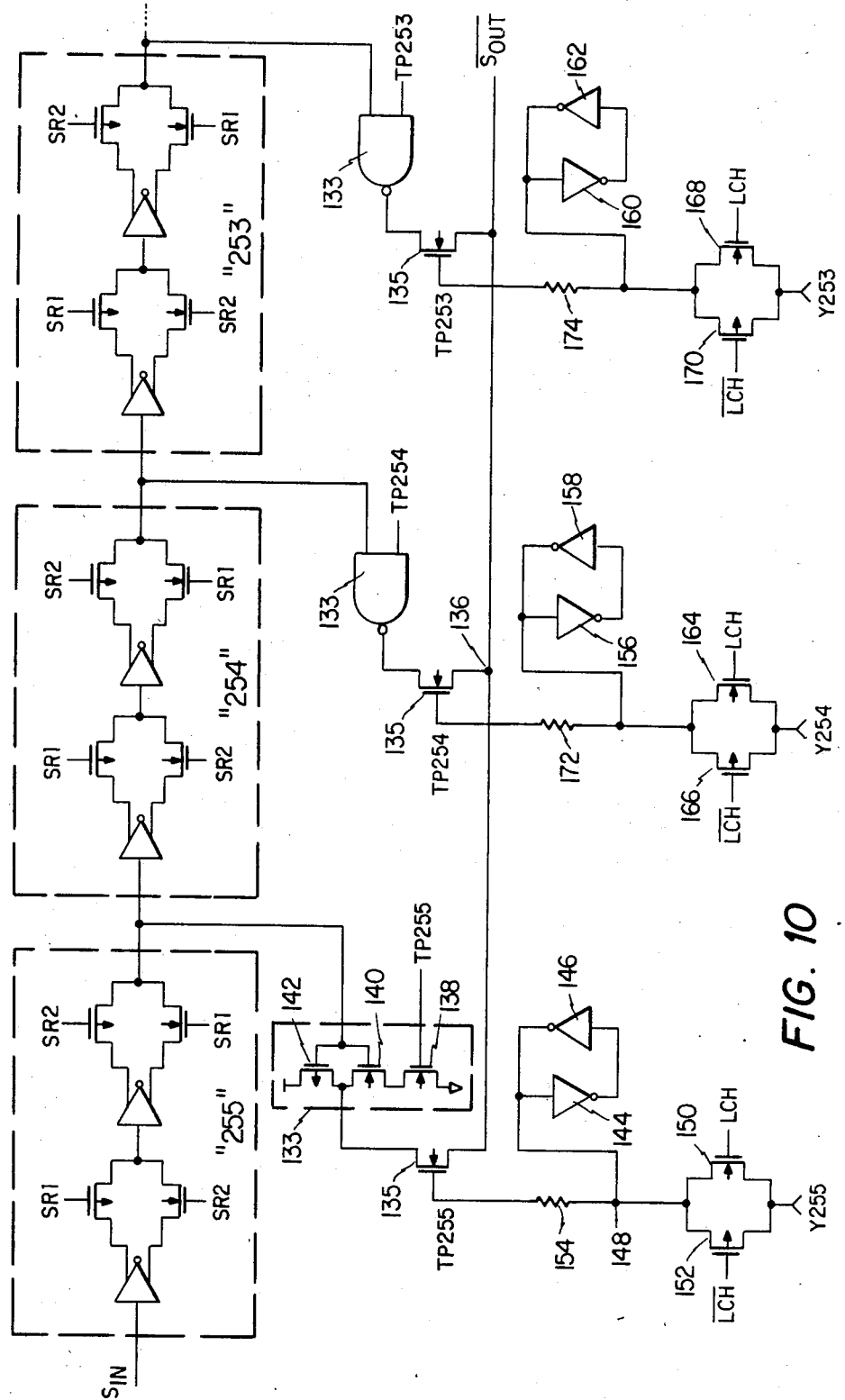
FIG. 10 illustrates a schematic diagram of a portion of the serial shift register and the tap latch.

Referring now to FIG. 10, there is illustrated a schematic diagram of the shift bits 255, 254 and 253 in a 256 bit shift register, with the serial input being input to the shift bit 255. The outputs of each of the shift bits are input to NAND gates 133, the other input of which is connected to a tap latch signal corresponding to the output of the tap latch decode circuit 52. The output of each of the NAND gates 133 is connected to the drain of a pass transistor 135, the source of which is connected to a line 136. The gate of the each of the transistors 135 associated with each of the shift bits is connected to the tap latch signal. For example, the tap latch signal associated with the shift bit 255 is TP255, the tap latch signal associated with the shift bit 254 is TP254 and the tap latch signal associated with the shift bit 253 is TP253.

The NAND gates 133 are each comprised of an N-channel transistor 138 having the source thereof connected to $V_{SS}$, the drain thereof connected to the source of an N-channel transistor 140 and the gate thereof connected to the tap latch signal. The transistor 140 has the drain thereof connected to the drain of P-channel transistor 142 and the gate thereof connected to the output of the respective shift register. The transistor 142 has the source thereof connected to $V_{DD}$ and the gate thereof connected to the output of the shift register associated therewith. When the tap latch signal is present, the transistor 138 provides a low resistive path to $V_{SS}$ and the output on the drain of the transistor 140 is a function of the shift register output. Although not a true NAND function, when the transistor 138 is turned off, the associated pass transistor 135 is also turned off. The NAND function provided by this configuraton reduces power drain of unselected taps.

The latch circuit for generating the latch signals TP255–TP00 is comprised of cross coupled inverters 144 and 146, each having the output connected to the input of the other for storing a logic state thereon. The input of the inverter 144 and output of the inverter 146 are connected to a node 148. The node 148 is connected to the drains of an N-channel transistor 150 and a P-channel transistor 152, the sources of which are connected to a decode line Y255 corresponding to the column address 255. The node 148 is connected to the gate of the pass transistor 134 through a series resistor 154. The gate of the transistor 150 is connected to a latch signal LCH and the gate of the transistor 152 is connected to the inverted latch signal $\overline{LCH}$. In operation, the presence of the LCH signal and the decode signal causes a high logic signal to be latched in the cross coupled inverters 144 and 146, thus storing the latch signal TP255 therein.

The shift bit 254 has an associated cross coupled inverter pair 156 and 158 and the shift bit 253 has an associated cross coupled inverter pair 160 and 162. The decode signal Y254 is input to a parallel pair of N- and P-channel transistors 164 and 166 and the decode signal Y253 is input to the cross coupled inverter pair 160 and 162 through a pair of N- and P-channel transistors 168 and 170. Series resistors 172 and 174 are provided for the shift bits 254 and 253, respectively.

In an important aspect of the present invention, the tap point is determined by an address which is decoded by the column address decoder. Therefore, only one decoder is required to both address a column and also address the particular tap point that constitutes the serial output of the serial access shift register. This significantly reduces the amount of circuitry required to provide the decode function for the tap of the shift register. Prior systems have utilized a separate decoder to determine which of the taps is to be selected. In addition, each shift bit in the register can be selected, thus providing more versatility for various applications.

Physical Layout

Referring now to FIG. 11, there is illustrated a schematic block diagram of the chip innerconnections and the approximate physical layout of the memory array 10 and associated transfer gate 54, shift register 34, tap latch 42 and column decoder 30. For illustrative purposes, only column 00 and column 01 are illustrated with their associated output circuits. Column 00 outputs an inverted and noninverted bit line for the column address 00 with B/L 00 connected to the drain of an N-channel transistor 176 and $\overline{B/L}_{00}$ connected to the drain of an N-channel transistor 178. The source of the transistor 176 is connected to the I/O line labeled $I/O_1$ and the source of the transistor 178 is connected to the inverted I/O line labeled $\overline{I/O}_1$. The gates of the transistors 176 and 178 are both connected to the column decode line 00 for activation thereof when column address 00 is selected. In a similar manner, an N-channel transistor 180 is connected between bit line B/L 01 and the I/O line, and an N-Channel transistor 182 is connected between $\overline{B/L}_{01}$ and $\overline{I/O}_1$ line. The gates of the transistors 180 and 182 are connected to the column decode line 01.

The transfer gate 54 is comprised of a pass transistor 184 having the drain thereof connected to the noninverted bit lines and the source thereof connected to the input of the respective shift bit. The gates of all the transistors 184 in the transfer gate circuit 54 are connected to the transfer control signal SCT. The tap latch 42 provides a latch for each shift bit and it is controlled by the column decode line associated therewith. For example, column decode line 00 is connected to the control input of tap latch TL00. The output of tap latch TL00 is input to the gate of a pass transistor 186, the drain of which is connected to the output of shift bit 00 and the source of which is connected to the SOUT line. A similar pass transistor 188 is connected between the output of shift bit 01 and the SOUT terminal, with the gate thereof connected to tap latch TL01.

Figure 12:
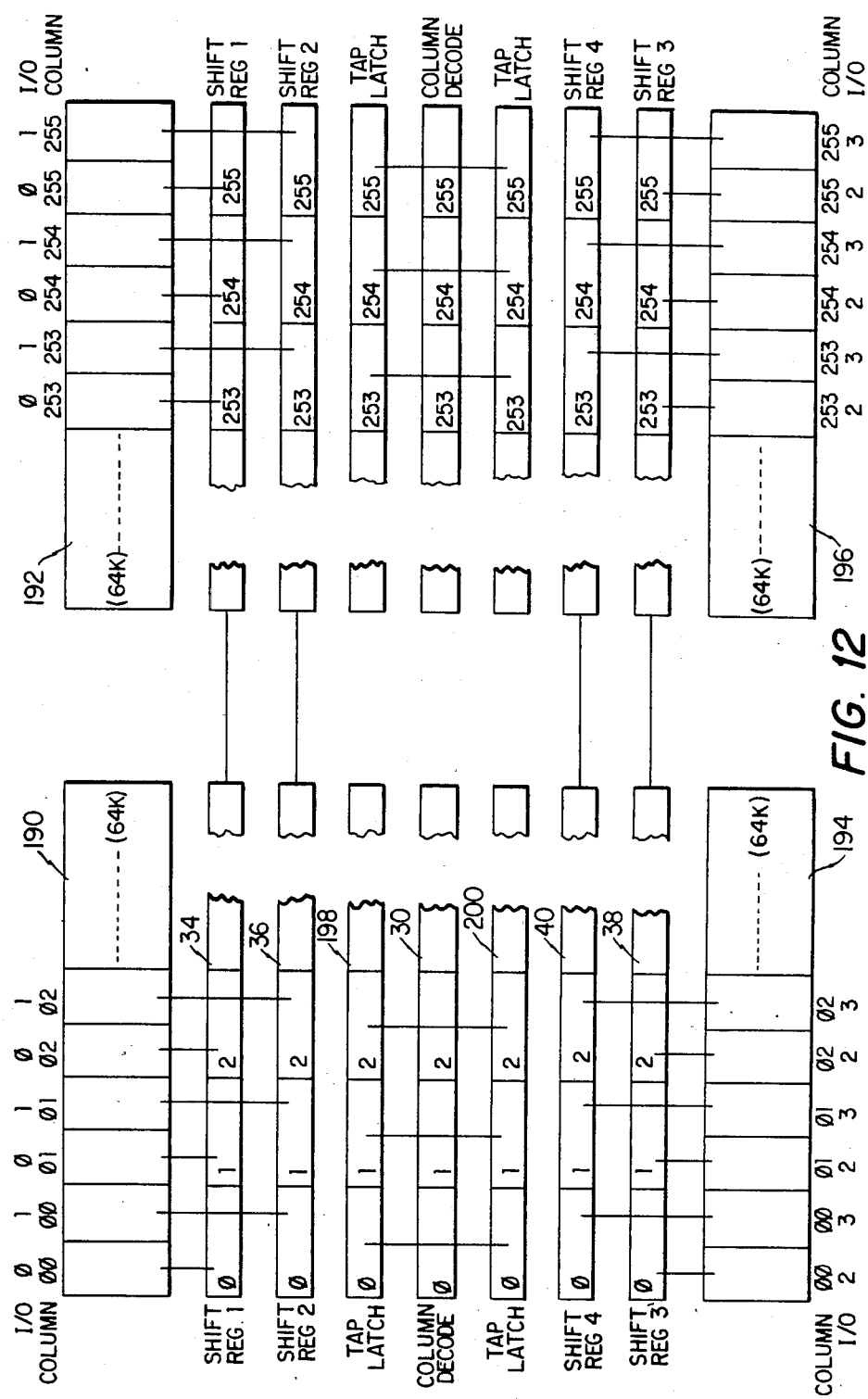
FIG. 12 illustrates a schematic block diagram of the preferred layout of the memory elements in the four pixel mapped memory arrays and the associated shift registers and tap latches.

Referring now to FIG. 12, there is illustrated the preferred embodiment of the physical layout of the memory of FIG. 1, with each of the memory arrays 10–16 having 256 rows and each of the associated shift registers 34–40 having 256 shift bits. Like numerals refer to like parts in the various Figures. The memory arrays 10 and 12 are combined into arrays 190 and 192. The array 190 contains column 00 through column 127 and array 192 contains column 128 through column 255. Each of the arrays 190–196 contain one half of columns of memory cells corresponding to two of the I/O lines $I/O_0$–$I/O_3$. The columns are intertwined such that columns having the same address are adjacent to each other. For example, column 00 of array 10 is the first physical column in array 190 and column 00 of array 12 is the second physical column in array 190. The I/O line is indicated by the subscript "0" for array 10 and "1" for array 12 and each is associated with the appropriate column address. An array 194 and an array 196 are provided on the other side of the semiconductor chip and comprise the columns of elements in the memory arrays 14 and 16, with the array 194 containing column 0 through column 127 and array 196 containing column 128 through column 255. Although not shown, the arrays 190 and 192 and arrays 194 and 196 are separated by the row decoder.

The shift registers 34 and 36 associated with the arrays 10 and 12 are disposed adjacent the arrays 190 and 192, with the shift bits associated with the respective columns and connected thereto. The transfer gate circuits 54 are not illustrated for simplicity purposes. The shift registers 38 and 40 are disposed adjacent the arrays 194 and 196 with the shift bits therein connected to the outputs of the respective columns. The shift registers 34–40 are divided into two halves, one half associated with the arrays 190 and 194 for shift bits 00 through 127 and the other half associated with arrays 192 and 196 for shift bits 128 through 255.

The tap latches 42 and 44 are combined into one tap latch 198 that is disposed between the column decoder 30 and the shift registers 34 and 36. The tap latches 46 and 48 are combined into one tap latch 200 disposed between the column decoder 30 and the shift registers 38 and 40. The random access I/O circuit and transfer gates are disposed between the shift registers and the respective arrays 190-196, as illustrated in FIG. 11.

Figure 13:
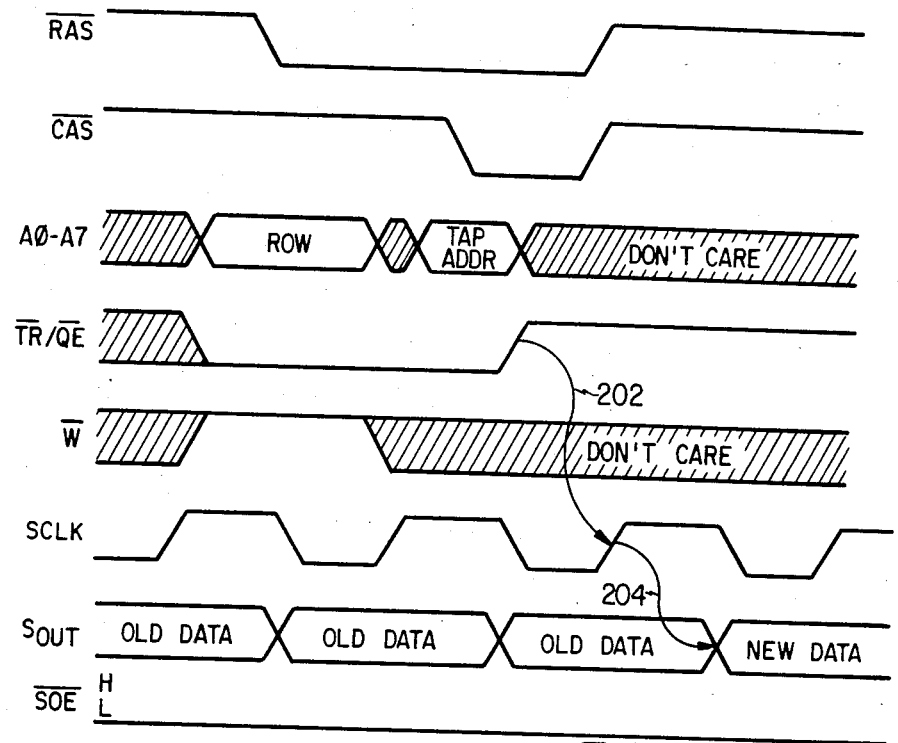
FIG. 13 illustrates a timing diagram for transferring data from memory to the shift register.

Referring now to FIG. 13, there is illustrated a timing diagram for transferring data from the memory to the associated serial shift register. To effect this transfer, it is necessary for the $\overline{TR/QE}$ signal to be at a low level when $\overline{RAS}$ changes to a low level. The $\overline{W}$ signal goes high to indicate the Read Transfer operation for transferring data from memory to the shift registers and then $\overline{RAS}$ goes low to select the appropriate row address. After a predetermined duration of time, the bit lines separate and the data is stored in the output of the associated sense amps of each of the columns. The $\overline{TR/QE}$ signal then goes high, thus generating the SCT signal to the transfer gates 54 and connecting the bit lines of each column with the associated shift bit in the shift register. The rising edge of $\overline{TR/QE}$ also determines the minimum amount of time before the rising edge of the next shift clock signal SCLK occurs, as indicated by a causality arrow 202. In the preferred embodiment, this is approximately 10 ns. This places the data from the bit lines on the input of the shift bits, thus loading the data therein. On the rising edge of SCLK, the data is transferred to the output of the shift bit, as indicated by the causality arrow 204. On the rising edge of $\overline{TR/QE}$, all of the old data is removed from storage in the shift bits and new data is stored therein. However, the first bit of data is not shifted out until a predetermined duration of time after the rising edge of SCLK occurs.

Figure 14:
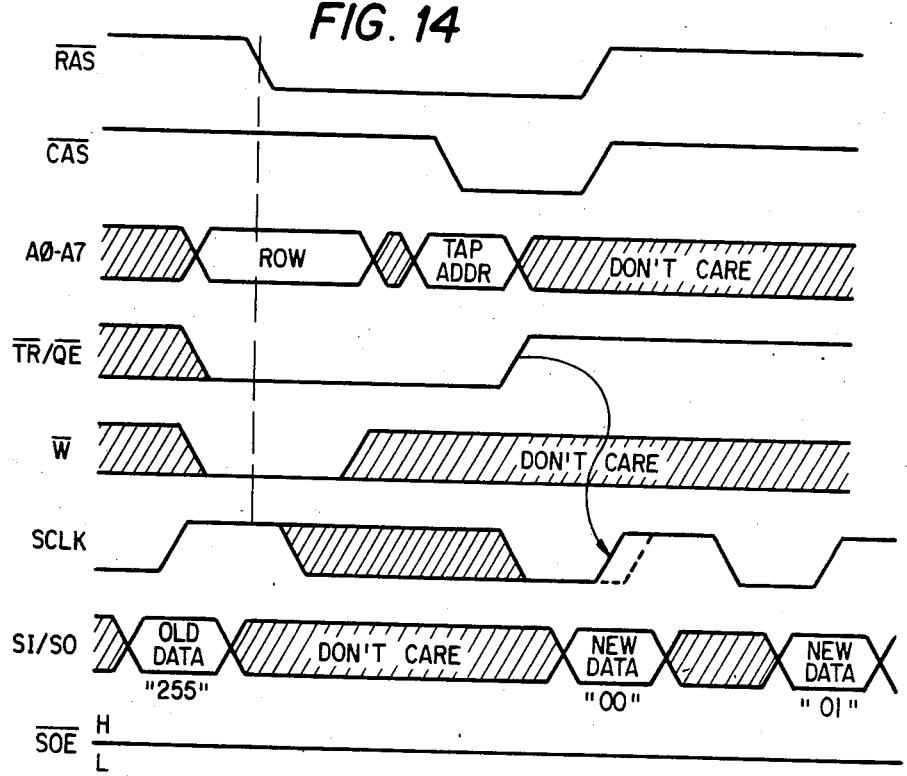
FIG. 14 illustrates a timing diagram for shifting data from the shift register to memory.

Referring now to FIG. 14, there is illustrated a timing diagram for transferring data from the shift register to storage in memory. This data can either be input on the serial input, shifted in and then transferred to memory or it can be shifted from one row in the memory to the shift register and then transferred back into memory in a different row. To initiate a transfer between the shift register and memory, $\overline{TR/QE}$ goes low before $\overline{RAS}$. The $\overline{W}$ signal is also low to indicate a Write Transfer operation for transferring data from the shift register to the memory. $\overline{RAS}$ then goes to a low level to read the row address and initiate the Write Transfer operation and also inhibit the shift clock. After a predetermined duration of time, $\overline{TR/QE}$ goes high to initiate data transfer and connect the outputs of the shift bits with the respective bit lines. The data present in the shift bits will then be transferred to the bit lines, sensed, latched by the internal sense amplifiers (not shown) and stored in memory. The shift clock will then be restarted after a predetermined duration of time relative to the occurance of the rising edge of the transfer signal. The rising edge of the shift clock may be delayed to ensure complete transfer of data prior to shifting. In the timing diagram illustrated in FIG. 14, the memory is configured such that the $S_0$-$S_3$ pins are multiplexed for both SIN and SOUT. Therefore, the $\overline{SOE}$ signal must be a high signal level to input data to the respective shift register.

Write Mask/Separate $\overline{CAS}$

Figure 15:
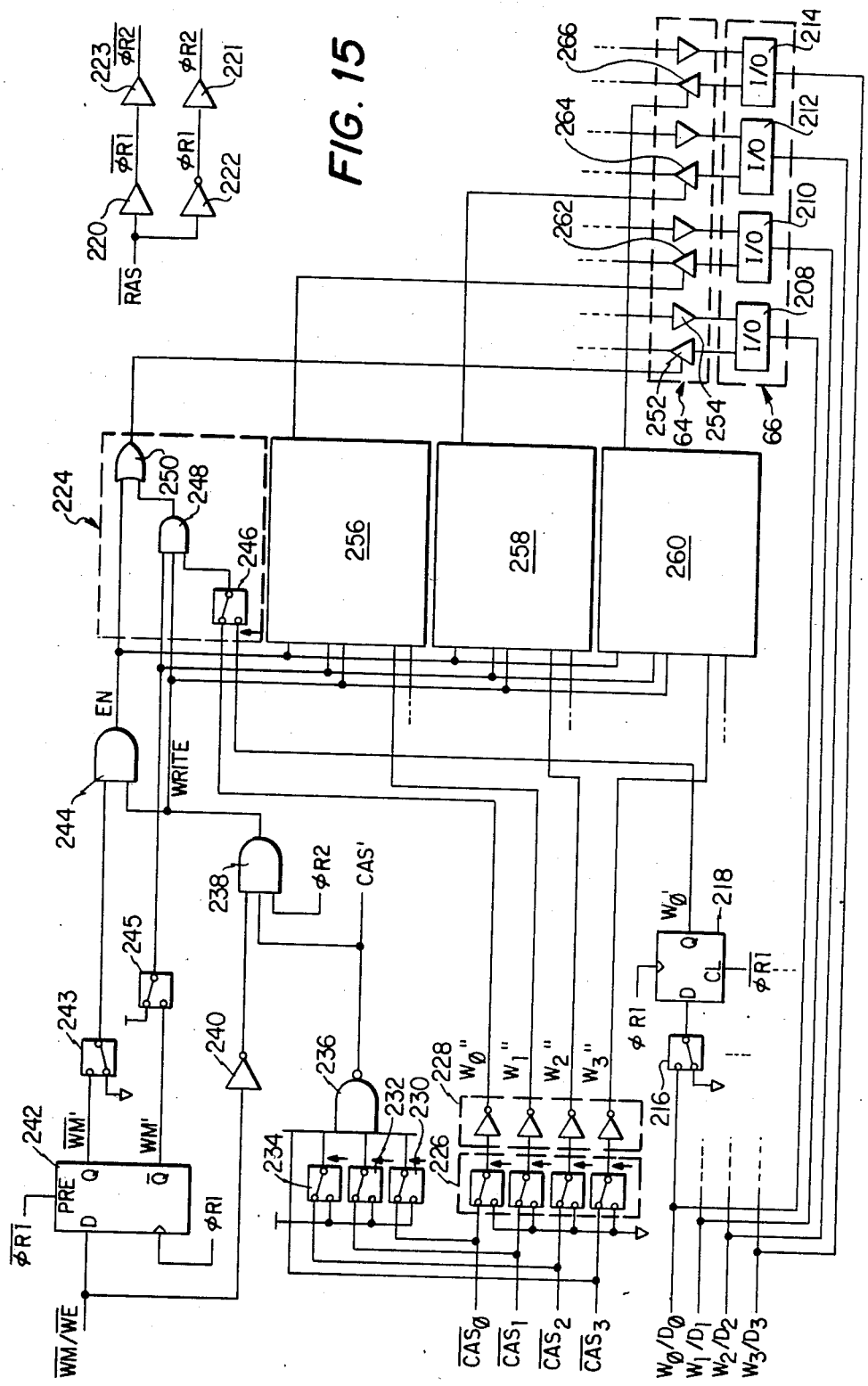
FIG. 15 illustrates a schematic block diagram of the circuitry for individually addressing individual ones of the four arrays on the semiconductor chip.

Referring now to FIG. 15, there is illustrated a schematic block diagram of the enable circuit 64, I/O buffer 66 and arbiter 68 of FIG. 1 for distinguishing between the Separate $\overline{CAS}$ inputs $\overline{CAS_0}$-$\overline{CAS_3}$ and the Write Mask feature. The I/O buffer 66 is comprised of separate I/O buffers 208, 210, 212 and 214 which are connected to the $W_0/D_0$-$W_3/D_3$ inputs. The I/O buffers 208-214 are operable to receive or output only data. The $W_0$-$W_3$ signals are each input to a separate Single Pole Double Throw switch 216, of which only one is shown. The output of the switch 216 is connected to the data input of a D-type flip-flop 218, with the switch 216 being operable to switch the data input between ground and the respective $W_0$-$W_3$ input. For simplicity purposes, only the circuitry associated with the $W_0$ input will be described. The clock input of the flip-flop 218 is connected to a clock signal $\phi R1$ and the clear input thereof is connected to a signal $\overline{\phi R1}$. $\phi R1$ is $\overline{RAS}$ delayed by a predetermined amount of time. This delay is provided by a noninverting circuit 220 and $\overline{\phi R1}$ is provided by an inverting circuit 222. The Q-output of the flip-flop 218 is the signal $W_0'$. The remaining outputs of the flip-flops not shown will be $W_1'$, $W_2'$ and $W_3'$.

The $W_0'$ signal is input to an arbitration circuit 224 to both determine which of the Write Mask or Separate $\overline{CAS}$ features is selected during fabrication of the memory and which of the I/O circuits 208-214 are to be enabled with the enable circuit 64.

The $\overline{CAS_0}$-$\overline{CAS_3}$ signals are input to one input of a switch circuit 226 comprised of four Single Pole Double Throw switches, the outputs of which are connected to separate inputs of a four inverter circuit 228. Each of the $\overline{CAS_0}$-$\overline{CAS_3}$ signals is associated with one Single Pole Double Throw switch in the switch circuit 226 which is operable to switch the output between $V_{SS}$ and the $\overline{CAS_0}$-$\overline{CAS_3}$ signals. The output of each of the inverters in the inverter circuit 228 is labeled $W_0''$, $W_1''$, $W_2''$ and $W_3''$, corresponding to each of the $\overline{CAS}_0$-$\overline{CAS}_3$ signals. For simplicity purposes, only the circuitry associated with the $W_0''$ circuit will be illustrated. This signal is input to the arbitration circuit 224.

The $\overline{CAS_0}$, $\overline{CAS_1}$ and $\overline{CAS_2}$ signals are input to Single Pole Double Throw switches 230, 232 and 234, respectively. The output of the switches 230-234 is input to separate inputs of a four input NAND gate 236. The $\overline{CAS_3}$ signal is input to the remaining input of the four input NAND gate 236. The switches 230-234 are operable to connect the three associated inputs of the NAND gate 236 with either the respective $\overline{CAS_0}$-$\overline{CAS_2}$ signals or $V_{DD}$. These switches, in conjunction with the switches in the switch bank 226, are associated with the Mask Write option which is determined during fabrication of the semiconductor device. If the device is to be controlled by separate $\overline{CAS}$ signals, the switches 230-234 and the switches in the switch bank 226 will be disconnected from $V_{DD}$ and connected to the respective $\overline{CAS}_0$-$\overline{CAS}_3$ signals. In a similar manner, the switches 216 associated with the $W_0$-$W_3$ signals will be connected to ground. The position of all mask programable switches in FIG. 15 is illustrated for the Separate $\overline{CAS}$ feature. For operation in the Write Mask mode, the opposite position of all the switches will be selected during fabrication of the device. However, it should be understood that these devices can be user selectable without requiring a permanent implementation in the metal mask.

The high output of the NAND gate 236 is present whenever any of the $\overline{CAS}_0$-$\overline{CAS}_3$ signals go low. Since no switch is associated with the $\overline{CAS}_3$ signal, this constitutes the $\overline{CAS}$ input when the Write Mask feature is selected and the switches 230-234 are connected to $V_{DD}$. The output of the NAND gate 236 is input to one input of a three input AND gate 238, one input of which is connected to the $\phi R2$ signal and the remaining input of which is connected to the $\overline{WM/WE}$ input through an inverter 240. The $\phi R2$ signal is generated by delaying the $\phi R1$ signal through a buffer 221. The output of the AND gate 238 constitutes the Write signal and this signal is input to the arbitration circuit 224. The Write signal is generated whenever one of the $\overline{CAS}_0$-$\overline{CAS}_3$ signals is low, when the $\overline{WM/WE}$ signal is low and when the $\phi R2$ signal is generated.

The M//WE signal is also input to the D-input of a D-type flip-flop 242 which constitutes the Write Mask latch. The clock input of the flip flop 242 is connected to the $\phi R1$ signal and the preset input thereof is connected to the $\phi \overline{R1}$ signal. The Q-output of the flip-flop 242 is labeled $\overline{WM}'$ and the $\overline{Q}$-output is labeled WM'. Whenever the signal on the $\overline{WM/WE}$ input goes low prior to generation of the $\phi R1$ signal, this data is clocked through to the output, which corresponds to selection of the Write Mask feature. Whenever a standard Write function is being performed, the signal on the D-input of the flip-flop 242 goes low after $\overline{RAS}$ falls low and $\phi R1$ is generated. The state of the outputs on the flip-flop 242 does not change in this condition.

The $\overline{WM}'$ signal is input to one input of an AND gate 244, the other input of which is connected to the Write signal output by the AND gate 238. The output of the AND gate 244 is labeled EN to indicate an enable function and is input to the arbitration circuit 224. The WM' signal output from the flip-flop 242 is also input to the arbitration circuit 224.

The arbitration circuit 224 is comprised of a Single Pole Double Throw switch 246 which receives the $W_0'$ and $W_0''$ signals with the output thereof connected to one input of a three input AND gate 248. The switch 246 is a mask selectable option similar to the switch 216, the switches in the bank 226 and the switches 230-234 are programmed during fabrication. The switch 246 is operable to select between the $W_0''$ and $W_0'$ signals for input to the AND gate 248. When the Write Mask feature is selected, the $W_0'$ signal is selected by the switch 246 and when the separate $\overline{CAS}$ feature is selected, the $W_0''$ signal is selected. The other two inputs of the NAND gate 248 are connected to the Write signal and $V_{DD}$. The output of the AND gate 248 is connected to one input of an OR gate 250, the other input of which is connected to the EN signal output by the AND gate 244.

In operation, the arbitration circuit 224 provides an output from the OR gate 250 in response to one of the $\overline{CAS}_0$-$\overline{CAS}_2$ signals being present or the Write Mask feature being selected. With the Write Mask feature, the signal on the input of the $\overline{WM/WE}$ terminal must be latched into the D-type flip-flop 242 to output a high signal for the WM' signal from the $\overline{Q}$-output of the flip-flop 242. The $\overline{WM/WE}$ signal also places a high signal on AND gate 238. Subsequent generation of the Write signal on the output of the AND gate 238 raises two inputs of the three input AND gate 248 to a high signal level. When the $W_0$ signal is present and latched into the flip-flop 218 to generate a $W_0'$ signal, the output of the AND gate goes high, thus raising the output of the OR gate 250 to a high level. In the separate $\overline{CAS}$ mode where the Write mask feature is deselected, the presence of a logic low level on any one of the $\overline{CAS}$ signals causes the output of the NAND gate 236 to go to a high level and this will cause the Write signal on the output of the AND gate 238 to be generated whenever a Write signal is present on the $\overline{WM/WE}$ input and $\phi R1$ is generated in response to $\overline{RAS}$ being generated. Since the switches 243 and 245 in the Separate $\overline{CAS}$ mode are switched away from the outputs of the flip-flop 242, one input of the AND gate 244 is low, maintaining EN signal low and the input of the AND gate 248 associated with the switch 245 is maintained at a high signal level. Therefore, AND gate 248 is controlled by the Write signal and the $W_0''$ signal switched through the switch 246. Therefore, the arbitration circuit 224 only produces an output from the OR gate 250 in response to the $W0''$ signal.

The output of the R gate 250 of the arbitration circuit is input to a tristate buffer 252 which is part of the enable circuit 64 and is connected to the I/O buffer 208 associated with the $D_0$ line. The tristate buffer 252 is utilized only for incoming data with a buffer 254 providing for outgoing data. Only the incoming data is buffered with tristate buffer 252 which is controlled by the arbitration circuit 224. In a similar manner, arbitration circuits 256, 258 and 260 are associated with tristate buffers 262, 264 and 266 for selectively enabling incoming data from the buffers 210, 212 and 214, respectively. The arbitration circuits 256-260 are similar to the arbitration circuit 224 and they are controlled by the $W_1''$-$W_3''$ signals, the $W_1'$-$W_3'$ signals or the EN signal. The EN signal is present when the Write Mask feature is available but not enabled in which case all four I/O buffers 208-214 are enabled. Each of the arbitration circuits 256-260 has a mask programmable switch internal thereto similar to the switch 246 in arbitration circuit 224.

Figure 16:
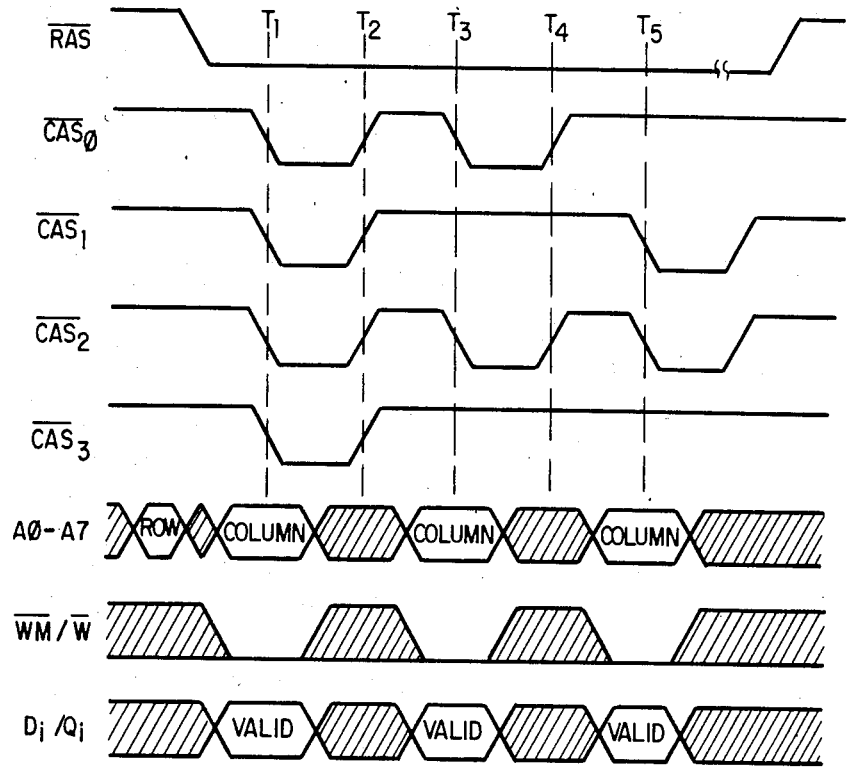
FIG. 16 illustrates timing diagrams for individually addressing the memories with separate column address strobes.

Referring now to FIG. 16, there is illustrated a timing diagram for the Separate $\overline{CAS}$ feature. In utilizing the Separate $\overline{CAS}$ feature, $\overline{RAS}$ goes low to select the row address. Thereafter, one or more of the $\overline{CAS}_0$-$\overline{CAS}_3$ signals goes low to load a column address into the column address latch. Additionally, the $\overline{CAS}_0$-$\overline{CAS}_3$ signals determine which of the I/O buffers is enabled to allow writing of data to the selected column in the selected row. When selected, data is written to that column position in the selected one of the arrays and then $\overline{CAS}$ returns to a high level. For illustrative purposes, the first column address is associated with all four signals $\overline{CAS}_0$-$\overline{CAS}_3$ going low at time $T_1$. The $\overline{CAS}$ signals return back to a high signal level at time $T_2$. With $\overline{RAS}$ remaining low, another column address is placed onto the address lines A0-A7 and $\overline{CAS}_0$ and $\overline{CAS}_2$ change to a low level at time $T_3$. This results in only two of the I/O buffers being enabled for writing data to only two of the array positions. The $\overline{CAS}_0$ and $\overline{CAS}_2$ signals go back to a high level at time $T_4$ and then another column address is latched into the column address latch at time T$_5$ when $\overline{CAS}_1$ and $\overline{CAS}_2$ go low. This allows only writing of data to the array associated with the $\overline{CAS}_1$ and $\overline{CAS}_2$ signals.

By utilizing the Separate $\overline{CAS}$ option, as compared to the Write Mask option, the memory can be operated in the page mode whereby a single row is selected and then the column address changed and a Write performed after each column is accessed. This allows updating of the pixel information in multiple arrays on the single chip which shares a common column and row decoder. Without the circuit described in FIG. 15, separate column decodes would be required for each array on the chip, thus increasing the density and complexity of the semiconductor circuit.

Midline Load

When data is transferred from memory to the serial shift register, it is important that all of the data in the shift register first be output to the display or storage elsewhere prior to reloading the shift register. Normally, this presents no problem since the shift register is mapped to the number of pixels in a given scan line. For example, a 256 bit shift register would map directly onto a display having a line width 256×n pixels across where n is some integer. The transfer from memory to shift register could then occur during the retrace time, thus providing sufficient time to ensure that all data is out of the shift register and to load the shift register with new data.

Heretofore, the shift clock was inhibited during the retrace time and during transfer of data from the memory to the shift register and then allowed to initiate shifting upon beginning of the next scan line. However, some displays have a pixel length for each scan line that is not a multiple of the width of the shift register. For example, a pixel length of 960 would require a 960 bit wide memory. If a symmetrical array of four serial access memorys were utiltized, each having a 256 bit wide shift register associated therewith, only 240 of the shift bits in each of the shift registers would be required for a scan line. The remaining sixteen bits in each of the shift registers would either have the data therein discarded or output as the first sixty four pixels on the next scan line. However, this would require transfer of data from the memory to the associated shift register during the middle of a scan line. A conventional scan rate is approximately 12 ns per pixel. This would require the shift registers to shift data through at a 48 ns rate. The data must therefore be loaded within 48 ns. The time required for data to be transferred to the shift bits from the bits lines is approximately 5 ns–10 ns for a conventional memory. If a sufficient time is not allowed for the data to be transferred from the bit lines to the inputs of the respective shift bits, the data may be invalid. Therefore, the timing relationship between the initiation of the transfer cycle and the next data shift is important to effect a proper transfer of data during one shifting cycle.

The clock and control generator 69 in the memory of FIG. 1 provides the circuitry for effecting a proper transfer of data without requiring the user to place exacting requirements on his timing relationship for the $\overline{TR}$ signal and the shift clock. That is, the circuit of the present invention is tolerant to slight timing deviations in the $\overline{TR}$ signal with respect to the last cycle of the shift clock. This tolerance allows the $\overline{TR}$ signal to occur before or after the optimum time for the occurrence of the actual transfer sequence, as Will be described hereinbelow.

Figure 17:
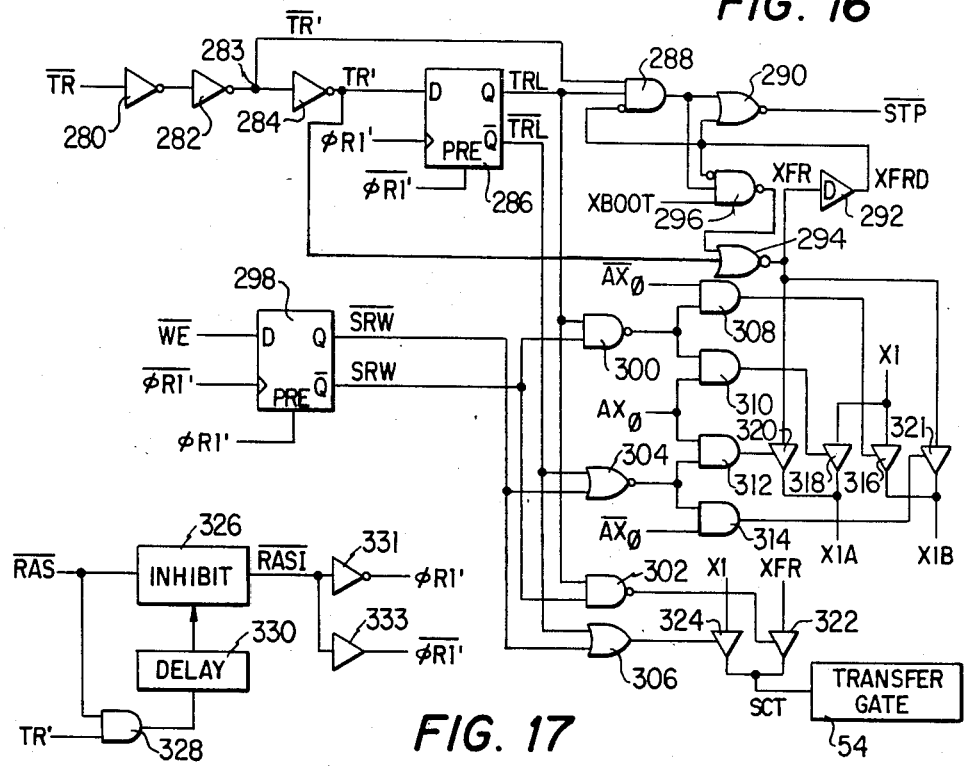
FIG. 17 illustrates a schematic diagram of the circuit for midline load.

Referring now to FIG. 17, there is illustrated a schematic diagram of the circuitry for the midline load feature. The $\overline{TR}$ signal is input through to inverters 280 and 282 to a node 283 labeled $\overline{TR}''$ and through an inverter 284 to the D-input of a flip-flop 286 which is the transfer latch. The Q-output of the flip-flop 286 is labeled TRL and a $\overline{Q}$-output is labeled $\overline{TRL}$. The flip-flop 286 is clocked by signal $\phi R1'$ which is an internal version of the $\overline{RAS}$ signal. As well be described hereinbelow the $\overline{RASI}$ signal is identical to the $\overline{RAS}$ signal upon initiation, but $\overline{RASI}$ can be controlled to remain low for a predetermined duration of time after $\overline{RAS}$ has gone high. $\overline{RASI}$ gives rise to signals $\overline{\phi R1}'$ and $\phi R1'$ which are similar to signals $\phi R1$ and $\phi R1'$, as described with reference to FIG. 15. The preset input of flip-flop 286 is connected to the signal $\overline{\phi R1}'$. The TRL output is connected to one input of a three input AND gate 288, one input of which is connected to the node 283 which is the $\overline{TR}'$ signal. The output of the AND gate 288 is connected to one input of a NOR gate 290, the output of which comprises the $\overline{STP}$ signal, which is the signal that stops or inhibits the shift clock. The other input of the NOR gate 290 is connected to a delayed transfer signal XFRD. The XFRD signal is connected to the inverted input of the AND gate 288. The delayed transfer signal XFRD is generated from a transfer signal XFR and delayed through a delay gate 292. The XFR signal is generated on the output of a NAND gate 296. The NAND gate 296 has one input thereof connected to the inverted XFRD signal, one input thereof connected to a signal "XBOOT" and the remaining input thereof connected to the output of the AND gate 288. The XBOOT signal is a signal which is generated in conventional dynamic memories to boot the word line above $V_{DD}$. Therefore, the output of the NAND gate 296 is low when a transfer sequence has been initiated and XBOOT goes high. The output of the NOR gate 294 is high only when both the output of the inverter 284 and the output of the NAND gate 296 are low, thereby preventing the generation of the transfer signal until XBOOT has occurred. Since XBOOT does not occur until the bit lines have had sufficient time to separate to a predetermined level, the bit lines will not be connected to the inputs of the shift bits until the bit lines have stabilized. This prevents invalid data from being generated due to the occurrence of a transfer signal prior to the time that the bit lines have stabilized.

The $\overline{WE}$ signal is input to the D-input of a flip-flop 298, the Q-output of which is labeled $\overline{SRW}$ and the $\overline{Q}$-output of which is labeled SRW. The flip-flop 298 is clocked by the $\overline{\phi R1}'$ signal and the preset input is connected to the $\phi R1'$ signal. The SRW signal is changed to a high level only when the $\overline{WE}$ signal is low prior to the occurrence of $\overline{RASI}$ going low. The $\overline{SRW}$ high signal indicates a Read Transfer wherein data is transferred from the memory to the shift register and the SRW high signal indicates a Write Transfer where data is transferred from the shift register to memory. In the Read Transfer mode, it is necessary to select the Word Line and then perform a transfer whereas in the Write Transfer mode, it is necessary to select SCT first, and then perform the transfer via the word line.

The SRW signal is input to one input of an NAND gate 300 and one input of a NAND gate 302. The other inputs of the NAND gates 300 and 302 are connected to the TRL signal. The $\overline{SRW}$ signal is connected to one input of a NOR Gate 304 and one input of an OR gate 306. The other inputs of the NOR gate 304 and OR gate 306 are connected to the $\overline{\text{TRL}}$ signal. The output of the NAND gate 300 is connected to one input of AND gates 308 and 310. The output of the NOR gate 304 is connected to one input of AND gates 312 and 314. The AND gates 308 and 314 have the other inputs thereof connected to a signal $\overline{\text{AX}_O}$ and the AND gates 310 and 312 have the other inputs thereof connected to a signal $AX_O$. The signal $AX_O$ is controlled by the least significant bit of the row address signal. The output of the AND gate 308 is connected to the enable input of a tristate buffer 316, the output of the AND gate 310 is connected to the enable input of a tristate buffer 318. The output of the AND gate 312 is connected to the enable input of the tristate buffer 320 and the output of the AND gate 314 is connected to the enable input of a tristate buffer 321. The outputs of the buffers 318 and 320 are connected together and labeled X1A and the outputs of the buffers 316 and 321 are connected together and labeled X1B. A signal labeled $X_1$ is input to the buffers 316 and 318 and the XFER signal from the output of the NOR gate 294 is connected to the inputs of buffers 320 and 321. The signal X1 represents the Word Line driver signal which is normally generated in the conventional circuit. The output of the NAND gate 302 is connected to the enable input of a tristate buffer 322 and the output of the OR gate 306 is connected to the enable input of a tristate buffer 324. The buffer 322 receives the XFR signal on the input thereof and generates the SCT signal for connection to the transfer gate 54 and the buffer 324 receives the X1 signal on the input thereof to generate the SCT signal on the output thereof to the transfer gate 54.

In operation, the presence of the SRW low signal indicates a Read Transfer and requires the Word Line to be high before the transfer signal occurs. The output of NAND gate 300 will be high, thus enabling AND gates 308 and 310. The output of NOR gate 304 will be low, disabling AND gates 312 and 314. AND gates 312 and 314 control the buffers 321 and 320 to select the XFR signal as a function of the state of $\overline{\text{AX}_O}$ and $AX_O$. In the Write Transfer mode where SRW is high, the output of NOR gate 304 is high and the output of NAND gate 300 is low, deselecting AND gates 308 and 310 which control the operation of buffers 316 and 318. The transfer signal SCT is controlled as a function of the XFR signal or the X1 signal by the state of the OR gate 306 and the NAND gate 302. The OR gate 306 outputs a high signal when either the $\overline{\text{SRW}}$ signal is high or the $\overline{\text{TRL}}$ signal is high. The NAND gate 302 outputs a high logic signal when either TRL is low or SRW is low.

Whenever the transfer signal occurs, it is necessary to maintain the SCT signal active for a predetermined period of time in order to allow sufficient time for the data to be transferred to or from the inputs of the respective shift bits. To provide for late occurrence (relative to $\overline{\text{RAS}}$ going high) of the $\overline{\text{TR}}$ signal, $\overline{\text{RAS}}$ is delayed from going from a low level to a high level for a predetermined duration of time. This is an internal function and does not affect the actual logic level of $\overline{\text{RAS}}$ external to the semiconductor memory. An inhibit circuit 326 is provided that is disposed in series with the $\overline{\text{RAS}}$ signal and the remaining $\overline{\text{RAS}}$ control signals to the semiconductor chip. As described above, this is denoted as $\overline{\text{RASI}}$. $\overline{\text{RAS}}$ is also input to one input of an AND gate 328, the other input of which is connected to the $\overline{\text{TR}}$ signal output from the inverter 284. The output of the AND gate 328 is input to a delay circuit 330, the output of which controls the inhibit circuit 326. The AND gate 328 outputs a signal when $\overline{\text{RAS}}$ goes high and $\overline{\text{TR}}$ goes high, indicating that a transfer is taking place. $\overline{\text{RAS}}$ is inhibited from going high with respect to the remainder of the circuit until a predetermined duration of time after the rising edge of $\overline{\text{TR}}$ has occurred. If the rising edge of $\overline{\text{TR}}$ occurs a sufficient amount of time prior to the rising edge of $\overline{\text{RAS}}$, the rising edge of $\overline{\text{RASI}}$ is coincident with the rising edge of $\overline{\text{RAS}}$. $\overline{\text{RASI}}$ is also input to invertor 331 to generate $\phi\text{R1}'$ and buffer 333 to generate $\phi\text{R1}'$.

Figure 18:
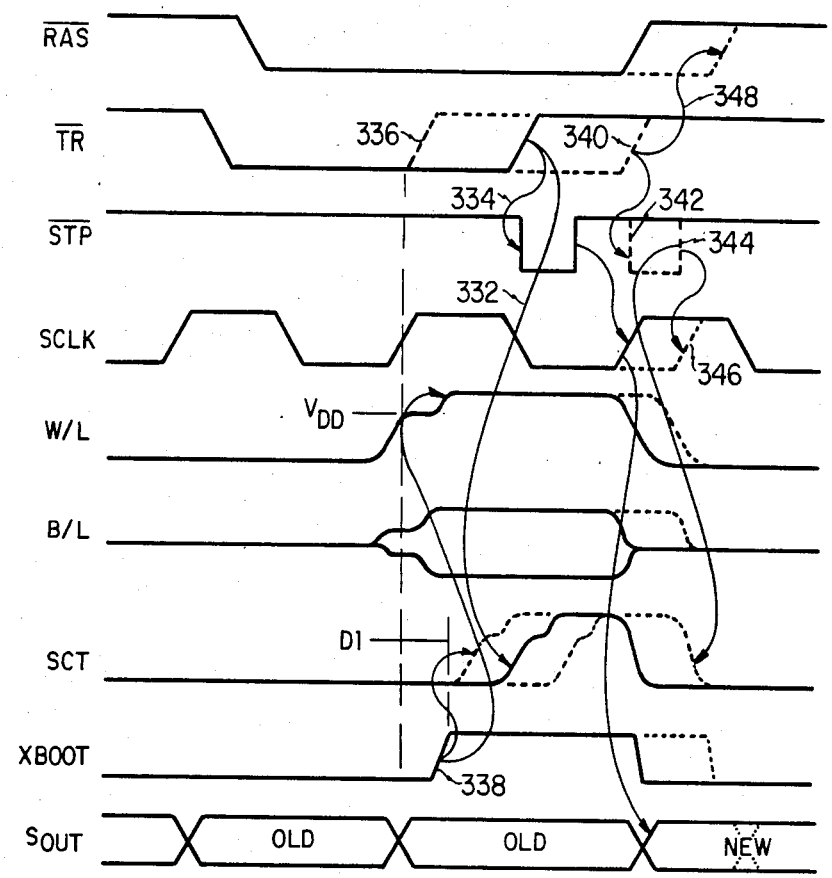
FIG. 18 illustrates a timing diagram for midline load.

Referring now to FIG. 18, there is illustrated a timing diagram for loading of data from the memory to the shift register. When the rising edge of $\overline{\text{TR}}$ occurs, it gives rise to the SCT signal, as indicated by an arrow 332. However, the SCT signal cannot be generated until the XBOOT signal is generated, as indicated by the input signals to the NAND gate 296 in FIG. 17. Therefore, the transfer cannot begin until the bit lines have sufficiently separated. Since XBOOT does not occur until after the bit lines begin to separate, this will ensure that a transfer operation is not initiated prior to separation of the bit lines. The rising edge of the $\overline{\text{TR}}$ signal also changes the state of the stop clock signal $\overline{\text{STP}}$ to a low level, as indicated by an arrow 334. This signal remains low until the physical transfer of data is complete and then changes to a high signal level. While the stop clock signal is at a low logic level, the leading edge of the next clock signal in the SCLK waveform will be inhibited. However, if the rising edge of $\overline{\text{TR}}$ occurs a sufficient amount of time prior to the leading edge of the stop clock signal, the occurrence of the leading edge of the SCLK signal will not be affected. The rising edge of the SCLK signal will cause data to be shifted through the shift bits and the new data to appear on the output of the shift register, as indicated by the SOUT signal.

When the $\overline{\text{TR}}$ signal occurs early, it is necessary to prevent the SCT signal from being generated until after the bit lines have stabilized. The early transfer signal is indicated by a rising edge 336 on the $\overline{\text{TR}}$ waveform. This occurs prior to the time at which the bit lines have sufficiently separated. However, the SCT signal is not generated until the rising edge 338 of XBOOT occurs. At this time, the SCT signal is generated, as indicated by a dotted line. The delay of the SCT signal is indicated by "D1".

When the rising edge of the $\overline{\text{TR}}$ waveform occurs late, it is necessary to maintain the SCT signal active and the bit lines separated for a predetermined amount of time to allow transfer of data to the shift bits before the cycle ends. In addition, it is also necessary to inhibit serial shifting of data in the shift register until complete transfer of data to the shift register has occurred. The late transfer signal is indicated by a rising edge 340 on the $\overline{\text{TR}}$ waveform which gives rise to a falling edge 342 on the $\overline{\text{STP}}$ waveform. As described above, the rising edge of the next SCLK signal cannot occur until the $\overline{\text{STP}}$ signal has again returned to a high level. This is indicated by a rising edge 344 which allows the SCLK signal to go high, as indicated by a rising edge 346. The duration of time between the falling edge 342 and the rising edge 344 allows sufficient time for the data to be transferred from the bit lines to the respective shift register. This must occur prior to generation of the leading edge of SCLK which clocks the new data out onto the output of the shift register. In addition to maintaining SCT on, it is also necessary to maintain the bit lines in the proper data state which is accomplished by delaying the internal change of $\overline{RASI}$ from a low to a high level. This is indicated by an arrow 348 which is the result of the inhibit circuit 326, described above with reference to FIG. 17.

In summary, there has been provided a semiconductor memory which utilizes four pixel mapped memories having the bits therein mapped to locations directly corresponding to pixels on a display. Each of the memory arrays has a serial shift register associated therewith and transfer gates for transfer of data therebetween. The serial shift register can either be connected in a circulating fashion with either serial in access or serial out access to each of the shift registers requiring only one pin per shift register. Alternately, the shift registers can be cascaded such that there are two pairs of cascaded shift register/arrays each pair with one serial input and one serial output requiring only one pin per array. Each of the shift registers is operable to be tapped at any output location therein. The location is determined from a decoded address which is received from the column decode line, thus requiring no additional decoding circuit to determine the tap point. Circuitry is provided to allow separate writing to locations in the four arrays without requiring separate decoding circuits. All four arrays share the same row and column decoders. The circuitry uses either a Write Mask format or separate column address strobes. Either feature can be utilized by selecting a metal mask option for the feature prior to fabrication of the device. Circuitry is also provided for allowing transfer of data from memory to shift register during the last cycle of the shift clock such that new data can immediately follow the old data without requiring the shifting operation to be temporarily terminated.

Although the preferred embodiment has been described in detail, it should be understood that various changes, substitutions and alterations can be made therein without departing from the spirit and scope of the invention as defined by the appended claims.

What is claimed is:

1. A semiconductor memory, comprising:
   a memory array having a plurality of memory elements arranged in rows and columns for storing data therein;
   row decode means for receiving and decoding a row address and selecting one of the rows of memory elements;
   column decode means for receiving and decoding a column address and selecting one of the columns of memory elements;
   said row and column decode means operating in conjunction to select one of the memory elements in said array for transferring data to or from the accessed memory element;
   shift register means for selectively accessing all of the data in the memory elements in the addressed row in said array, said shift register means having a plurality of storage locations for storing the accessed data in a serial format according to the order of the columns in said array such that the accessed data can be serially output therefrom;
   tap means for storing tap decode information, and for selecting a storage location in said shift register means responsive to said tap decode information, said selected storage location containing the first data to be serially output;
   said column decode means receiving and decoding an external tap address to provide tap decode information to said tap means corresponding to the storage location containing the first data to be serially output, said tap decode information defining any of the storage locations in said shift register means; and
   control means for shifting data out of said shift register means for the selected storage location such that only data between the selected storage location and the last piece of data in the serial format is output.

2. The semiconductor memory of claim 1 wherein said shift register means comprises:
   a serial shift register having a plurality of shift bits equal in number to the number of columns in said array, wherein each said storage location in said shift register means comprises one of said shift bits; and
   transfer means for selectively connecting the input of each of the shift bits in said serial shift register to the accessed memory elements in the addressed row for tranfer of data to or from the associated one of said shift bits, said transfer means controlled by said control means.

3. The semiconductor memory of claim 2 wherein said tap means comprises:
   latch means for storing said tap decode information, said tap decode information determining the shift bit containing the first bit to be serially output; and
   a plurality of pass gates, each of said pass gates connected between the output of one of said shift bits and a single output node and controlled by said tap decode information stored in said latch means, activation of the select one of said pass gates connecting the output of its associated one of said shift bits to said output node.

4. A semiconductor memory, comprising:
   a plurality of memory arrays each having an equal number of memory elements arranged in rows and columns for storing data therein;
   row decode means for receiving and decoding a row address and selecting one of the rows of memory elements in each of said arrays;
   column/tap decode means for receiving and decoding a column/tap address and operable in a first mode to provide a column decode signal and in a second mode to provide a tap decode signal;
   said row decode means and said column/tap decode means in the first mode operable to access one of the memory elements for transfer of data to or from the accessed memory elements in each of the arrays;
   transfer means associated with each of said arrays for accessing all of the memory elements in the addressed row in the associated one of said arrays;
   shift register means associated with each of said transfer means for storing the accessed data in a serial format, the serial format corresponding to the order of columns from which data was accessed by said transfer means;
   tap means operable in response to said column/top means operating in the second mode for selecting a tap position within the serial format in said register means from which data is to be output, said tap decode signal defining any position in the serial format as the tap output; and
   control means for selecting the first or second mode of said column/tap decode means;

wherein said transfer means is responsive to said control means so that, responsive to the selection of said second mode, said transfer means transfers said accessed data to said shift register means;

wherein said tap means is responsive to said column/tap decode means so that said tap means selects the tap position responsive to said tap decode signal generated by said column/tap decode means in said second mode;

and wherein said shift register means is controlled to shift the serially formatted data therethrough and out through the tap position.

5. The semiconductor memory of claim 4 wherein said shift register means comprises a serial shift register having a plurality of shift bits equal in number to the columns in the associated one of said arrays and each associated with one of the columns in said associated array.

6. The semiconductor memory of claim 5 wherein said tap means comprises:

means for storing said tap decode signal output by said column/tap decode means; and a plurality of pass gates connected between the output of each of said shift bits and a common output node, each of said pass gates controlled by said tap decode signals stored in said latch means to connect the output of the respective one of said shift bits to said common node.

7. The semiconductor memory of claim 4 wherein said transfer means comprises a plurality of pass gates associated with each of the columns in the associated one of said arrays and the input of each of the associated ones of said shift bits and operable in response to said control means to connect the output of the accessed one of said memory elements in each of the columns of said arrays to the input of the associated one of said shift bits.

8. The semiconductor memory of claim 4 wherein said column/tap decode means comprises:

a column address latch for storing said column/tap address therein; and means for decoding the contents of said column address latch to provide the corresponding column decode signal or tap decode signal, said means operable to generate one of a plurality decode signals equal in number to the columns of the associated one of said arrays, only one of said output decode lines activated for a given address in said column address latch.

9. The semiconductor memory of claim 4 wherein said control means is operable to shift data from said shift register means through said tap position selected by said tap means in an ascending order from the tap point to the data output by the highest order one of the columns in said associated array.

10. A method for serially accessing data from a semiconductor memory array having memory elements arranged in rows and columns, comprising:

decoding a row address to select one of the rows of memory elements;

enabling a column/tap address decoder to decode a column/tap address to output a tap decode signal, said column/tap address decoder being adapted to decode said column/tap address to select one of the memory elements defined by the selected row when not so enabled;

transferring the data from all of the memory elements in said selected row to the shift bits in a serial shift register, the shift bits arranging the transferred data in a serial format;

tapping the shift register at the shift bit corresponding to the tap decode signal to provide a tap point for the serial output of data stored in the shift register; and controlling the shift register to shift the data stored therein out from the tap point.

11. The method of claim 10 wherein each of said shift bits in said shift register has an output, and wherein a pass gate is associated with each shift bit, said pass gate being connected between the output of its associated shift bit and the serial output of said shift register;

and further comprising:

storing the tap decode signal in a tap latch; and enabling the pass gate corresponding to the tap decode signal stored in said tap latch, so that the output of said shift bit associated with said enabled pass gate is connected to said serial output of said shift register.

12. A memory device, comprising:

an array of addressable memory cells, arranged in rows and columns;

row address means, responsive to a row address signal, for selecting a row of memory cells in said array;

column address means, responsive to a column address signal, for selecting a memory cell in said selected row of memory cells;

input means for writing data to said selected memory cell in said array;

output means for presenting the data contained in said selected memory cell in said array;

a register comprised of a plurality of memory cells;

means, responsive to a transfer signal, for transferring the contents of memory cells in said selected row to said memory cells in said register;

serial output means for presenting the contents of a selected memory cell in said register; and serial clock means, responsive to a serial clock signal, for shifting to said serial output means the contents of another memory cell in said register so that, responsive to a series of said serial clock signals, the contents of a series of memory cells is presented by said serial output means;

wherein said column address means, responsive to said transfer signal, selects the memory cell in said register to be connected to said serial output means, said selected memory cell in said register corresponding to said column address signal.

13. The memory device of claim 12, further comprising:

latch means, responsive to said column address means, for storing the location of said selected memory cell in said register to be connected to said serial output means until another memory cell in said register is selected to be connected to said serial output means.

14. The memory device of claim 13, wherein said register contains a number of memory cells equal to the number of columns in said array;

wherein each memory cell in said register has an output;

and wherein said serial output means is responsive to said latch means, so that said serial output means is connected to the output of said memory cell in said register corresponding to the location stored in said latch means.

15. The memory device of claim 14, wherein said column address means has an output for each memory cell in said register;
   wherein said column address means provides a decode signal at the output associated with the selected memory cell in said register to be connected to said serial output means;
   and wherein said latch means comprises:
      a latch input means, for each memory cell in said register, connected to the output of said column address means corresponding to said memory cell in said register;
      a pass gate means, for each memory cell in said register, said pass gate means having an input connected to a control node, for connecting the output of the memory cell associated therewith to said serial output means;
      a first inverter, for each memory cell in said register, said first inverter having an input connected to said control node and an output;
      a first gate means for selectively connecting said latch input means to said control node, responsive to a latch clock signal;
      a second inverter associated with each said first inverter, each said second inverter having an input connected to the output of its associated first inverter, and having an output connected to the input of its associated first inverter; and
      means for generating a latch clock signal for a predetermined time responsive to said column address means providing a decode signal, so that said latch input means for each memory cell in said register is connected to said control node for said predetermined time by said first gate means;
   wherein said pass gate means associated with said selected memory cell connects the output of said memory cell to said serial output means, responsive to said control node receiving said decode signal;
   and wherein said first inverter and said second inverter latch said decode signal at said control node so that, after said predetermined time that said latch clock is generated, said output of said selected memory cell in said register remains connected to said serial output means.

16. The memory device of claim 15, further comprising:
   a second gate means, for each memory cell in said register, said second gate means having an input connected to said control node, for connecting said output of said memory cell in said register to said pass gate means, responsive to said control node receiving said decode signal.

17. A memory device, comprising:
   an array of addressable memory cells, arranged in rows and columns;
   row strobe means for receiving a row strobe signal;
   column strobe means for receiving a column strobe signal;
   row address means, responsive to a row address signal and coupled to said row strobe means, for selecting the row of memory cell in said array corresponding to said row address signal, responsive to said row strobe signal;
   column address means, responsive to a column address signal and coupled to said column strobe means, for selecting the memory cell in said selected row of memory cells corresponding to said column address signal, responsive to said column strobe signal;
   input means for writing data to said selected memory cell;
   output means for presenting the data contained in said selected memory cell;
   a register comprised of a plurality of memory cells;
   means, responsive to a transfer signal, for transferring the contents of memory cells in said selected row to said memory cells in said register;
   serial output means for presenting the contents of a selected memory cell in said register; and
   serial clock means, responsive to a serial clock signal, for shifting to said serial output means the contents of another memory cell in said register so that, responsive to a series of said serial clock signals, the contents of a series of memory cells is presented by said serial output means;
   wherein said column address means, responsive to a transfer enable signal, selects the memory cell in said register to be connected to said serial output means, said selected memory cell in said register corresponding to said column address signal.

18. The memory device of claim 17, further comprising:
   latch means, responsive to said column address means, for storing the location of said selected memory cell in said register to be connected to said serial output means, until such time as said column address means, responsive to said transfer enable signal, selects another memory cell in said register to be connected to said serial output means.

19. The memory device of claim 18, wherein said register contains a number of memory cells equal to the number of columns in said array;
   wherein each memory cell in said register has an output;
   and wherein said serial output means is responsive to said latch means so that said serial output means is connected to the output of said memory cell in said register corresponding to the location stored in said latch means.

20. The memory device of claim 19, further comprising:
   a transfer control means for receiving a transfer control signal having a first logic state and a second logic state; and
   means, coupled to said row strobe means and to said transfer control means, for generating a transfer enable signal responsive to said transfer control signal being at its first logic state at the time said row strobe signal occurs.

21. The memory device of claim 20, further comprising:
   means, coupled to said transfer control means, for generating a transfer signal responsive to said transfer control signal going from its first logic state to its second logic state.

22. The memory device of claim 19, wherein said column address means is also responsive to said column strobe means so that said column address means selects a memory cell in said register to be connected to said serial output means responsive to said column address, said tranfer enable signal and said column strobe means, thereby allowing said transferring means to transfer the contents of another row of said array to said register, without said column address means selecting another memory cell in said register to be connected to said serial output means in the absence of said column strobe signal.

* * * * *